(12) United States Patent
Adachi et al.

(10) Patent No.: US 9,722,101 B2
(45) Date of Patent: Aug. 1, 2017

(54) SOLAR CELL, SOLAR CELL MANUFACTURING METHOD, AND SOLAR CELL MODULE

(71) Applicant: KANEKA CORPORATION, Osaka-shi, Osaka (JP)

(72) Inventors: Daisuke Adachi, Settsu (JP); Kenji Yamamoto, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 14/346,261

(22) PCT Filed: Dec. 21, 2012

(86) PCT No.: PCT/JP2012/083291
§ 371 (c)(1),
(2) Date: Mar. 20, 2014

(87) PCT Pub. No.: WO2013/161127
PCT Pub. Date: Oct. 31, 2013

(65) Prior Publication Data
US 2015/0075601 A1    Mar. 19, 2015

(30) Foreign Application Priority Data

Apr. 25, 2012  (JP) ................................. 2012-100355

(51) Int. Cl.
*H01L 31/0224*   (2006.01)
*H01L 31/0747*   (2012.01)
*H01L 31/18*     (2006.01)

(52) U.S. Cl.
CPC ............... *H01L 31/022425* (2013.01); *H01L 31/022433* (2013.01); *H01L 31/022475* (2013.01);
(Continued)

(58) Field of Classification Search
CPC ..... H01L 31/022425; H01L 31/022475; H01L 31/022433; H01L 31/1804; H01L 31/1884;
(Continued)

(56) References Cited

U.S. PATENT DOCUMENTS 4,412,900 A * 11/1983 Tanaka ............... H01L 27/14603
136/258
4,586,988 A    5/1986 Nath et al.
(Continued)

FOREIGN PATENT DOCUMENTS

EP    2312641 A1   4/2011
EP    2428997 A2   3/2012
(Continued)

OTHER PUBLICATIONS

Tsuge, Sadaji; machine translation of JP 2011-199045; published Oct. 6, 2011; printed Feb. 23, 2015; pp. 1-19.*
(Continued)

*Primary Examiner* — Allison Bourke
*Assistant Examiner* — Edward Schmiedel
(74) *Attorney, Agent, or Firm* — Alleman Hall Creasman & Tuttle LLP

(57) ABSTRACT

A solar cell includes a photoelectric conversion section having first and second principal surfaces, and a collecting electrode formed on the first principal surface. The collecting electrode includes first and second electroconductive layers in this order from the photoelectric conversion section side, and includes an insulating layer between the first and second electroconductive layers. The insulating layer is provided with an opening, and the first and second electroconductive layers are in conduction with each other via the opening provided in the insulating layer. The solar cell has, on the first principal surface, the second principal surface or
(Continued)

a side surface of the photoelectric conversion section, an insulating region freed of a short circuit of front and back sides of the photoelectric conversion section, and the surface of the insulating region is at least partially covered with the insulating layer.

20 Claims, 9 Drawing Sheets

(52) U.S. Cl.
CPC ...... *H01L 31/0747* (2013.01); *H01L 31/1804* (2013.01); *H01L 31/1884* (2013.01); *Y02E 10/547* (2013.01); *Y02P 70/521* (2015.11)

(58) Field of Classification Search
CPC ............. H01L 31/0747; H01L 31/0216; H01L 31/02161; H01L 31/02167; H01L 31/04; H01L 31/0203; H01L 31/022441; H01L 31/022491
USPC .................................................. 136/251, 259
See application file for complete search history.

(56) References Cited

U.S. PATENT DOCUMENTS

| | | | | |
|---|---|---|---|---|
| 5,330,585 | A * | 7/1994 | Chang ............... | H01L 31/02168 136/256 |
| 5,935,344 | A | 8/1999 | Endo et al. | |
| 6,091,019 | A * | 7/2000 | Sakata .............. | H01L 31/02242 136/256 |
| 6,268,558 | B1 * | 7/2001 | Kubota ................ | H01L 31/046 136/244 |
| 2001/0013362 | A1 * | 8/2001 | Kondo .......................... | 136/265 |
| 2006/0219292 | A1 | 10/2006 | Asaumi et al. | |
| 2009/0223549 | A1 | 9/2009 | Ounadjela et al. | |
| 2009/0223562 | A1 * | 9/2009 | Niira et al. .................... | 136/256 |
| 2011/0308587 | A1 | 12/2011 | Yamazaki | |
| 2012/0291844 | A1 | 11/2012 | Tsuge | |

FOREIGN PATENT DOCUMENTS

| | | |
|---|---|---|
| JP | 6066426 A | 4/1985 |
| JP | 9129904 A | 5/1997 |
| JP | 2000058885 A | 2/2000 |
| JP | 2001044461 A | 2/2001 |
| JP | 2006310774 A | 11/2006 |
| JP | 2011199045 A | 10/2011 |
| JP | 201223347 A | 2/2012 |
| WO | 2011045287 A1 | 4/2011 |
| WO | 2012029847 A1 | 3/2012 |

OTHER PUBLICATIONS

The Engineering Toolbox; Metals-melting temperature; http://www.engineeringtoolbox.com/melting-temperature-metals-d_860.html; accessed and printed May 16, 2015.*

Pattern definition; define Pattern at Dictionary.com; http://dictionary.reference.com/browse/pattern; accessed and printed Sep. 1, 2015.*

Liu, C. M., et al. "ITO as a diffusion barrier between Si and Cu." Journal of the Electrochemical Society, vol. 152, No. 3, Feb. 1, 2005, pp. G234-G239.

ISA Japanese Patent Office, International Search Report of PCT/JP2012/083291,WIPO, 2 pages.

International Bureau of WIPO, International Preliminary Report on Patentability Issued in Application No. PCT/JP2012/083291, Nov. 6, 2014, 6 pages.

European Patent Office, Extended European Search Report Issued in Application No. 12875253.2, Jun. 24, 2015, Germany, 9 pages.

* cited by examiner

5A1

5A2

5B1

5B2 before annealing
(after printing)

after annealing before sintering after sintering onset
(initial sintering stage)

grain boundary after sintering onset

SOLAR CELL, SOLAR CELL MANUFACTURING METHOD, AND SOLAR CELL MODULE

TECHNICAL FIELD

The present invention relates to a solar cell and a method of manufacture thereof. Further, the present invention relates to a solar cell module.

BACKGROUND ART

Since energy issues and global environmental issues are becoming more serious, solar cells are receiving more attention as an alternative energy source for replacing fossil fuels. In the solar cell, carriers (electrons and holes) generated by light irradiation to a photoelectric conversion section composed of a semiconductor junction or the like are extracted to an external circuit to generate electricity. A collecting electrode is provided on the photoelectric conversion section of the solar cell for efficiently extracting carriers generated at the photoelectric conversion section to the external circuit.

For example, in a crystalline silicon-based solar cell using a single-crystalline silicon substrate or a polycrystalline silicon substrate, a collecting electrode made of a slender metal is provided on a light receiving surface. Also, in a heterojunction solar cell having amorphous silicon layers and transparent electrode layers on a crystalline silicon substrate, collecting electrode(s) are provided on the transparent electrode layer(s).

The collecting electrode of the solar cell is generally formed by pattern-printing a silver paste by a screen printing method. This method is simple in terms of the process itself, but has such a problem that the material cost of silver is high, and that the resistivity of the collecting electrode increases because a silver paste material containing a resin is used. For decreasing the resistivity of the collecting electrode formed of a silver paste, it is necessary to thickly print the silver paste. However, since the line width of the electrode increases with the increase of the print thickness, thinning of the electrode is difficult, and the shading loss by the collecting electrode increases.

For solving these problems, a method is known in which a collecting electrode is formed by a plating method excellent in terms of material and process costs. For example, Patent Documents 1 to 3 disclose a solar cell in which a metallic layer made of copper or the like is formed by a plating method on a transparent electrode that forms a photoelectric conversion section. In Patent Documents 1 and 2, first, a resist material layer (insulating layer) having an opening section matching the shape of a collecting electrode is formed on the transparent electrode layer of the photoelectric conversion section, and then a metallic layer is formed at the resist opening section of the transparent electrode layer by electroplating. Thereafter, the resist is removed to form a collecting electrode having a predetermined shape.

Patent Document 3 discloses a method in which an insulating layer of $SiO_2$ or the like is provided on a transparent electrode, a groove extending through the insulating layer is then provided to expose the surface or side surface of the transparent electrode layer, and a metal collecting electrode is formed so as to be in conduction with an exposed area of the transparent electrode. Specifically, a method is proposed in which a metal seed is formed on the exposed area of the transparent electrode layer by a light induced plating method or the like, and a metal electrode is formed by electroplating with the metal seed as an origination point. This method is more advantageous in terms of material costs and process costs because it is not necessary to use a resist unlike Patent Documents 1 and 2. By providing a low-resistance metal seed, the contact resistance between a transparent electrode layer and a collecting electrode can be lowered.

In formation of a photoelectric conversion section of a solar cell, thin-films such as a semiconductor layer, a transparent electrode layer and a metal electrode are generally formed on the surface of a substrate by a plasma-enhanced CVD method, a sputtering method or the like. These thin-films exist not only on the front surface of a substrate, but also on the side surface and on the back surface since the deposited films wrap around thereon, and thereby cause a short circuit and leakage between the front surface and the back surface. For preventing the above-described wraparound, for example, a method is proposed in Patent Document 4 in which a semiconductor layer and a transparent electrode layer are formed with the peripheral end portion of a crystalline silicon substrate covered with a mask.

Patent Documents 5 and 6 disclose methods for preventing a short circuit by performing predetermined processing after forming a semiconductor thin-film and an electrode on a substrate. Specifically, Patent Document 5 discloses a method in which a groove is formed by laser irradiation, and thereafter a crystalline silicon substrate is cleaved along the groove to form a solar cell in which the side surface of a photoelectric conversion section is composed of a cut surface. In Patent Document 6, a method is proposed in which a semiconductor layer and a transparent electrode layer formed on a crystalline silicon substrate are removed by laser irradiation to form a groove. Either a semiconductor thin-film or an electrode is not present on the cut surface in Patent Document 5 and the surface of the groove in Patent Document 6, and therefore the problem of short circuit resulting from wraparound is solved.

In Patent Document 6, a configuration is illustrated in which a transparent electrode layer and a semiconductor layer of a conductivity type are removed by laser irradiation, but it is difficult to selectively remove only these layers by laser irradiation. Therefore, generally a groove formed by laser irradiation reaches the surface or the inside of a crystalline silicon substrate.

PRIOR ART DOCUMENTS

Patent Documents

Patent Document 1: JP 60-66426
Patent Document 2: JP-A 2000-58885
Patent Document 3: JP-A 2011-199045
Patent Document 4: JP-A 2001-44461
Patent Document 5: JP-A 2006-310774
Patent Document 6: JP-A 9-129904

Non-Patent Document

Non-Patent Document 1: C. M. Liu et. al., *Journal of The Electrochemical Society*, 152 (3), G234~G239, (2005).

SUMMARY OF THE INVENTION

Problems to be Solved by the Invention

According to the method in Patent Document 3, a collecting electrode with a thin-line pattern can be formed by a plating method without using an expensive resist material. However, a method of forming a metal seed serving as an origination point of electrolytic plating using a light induced plating method as in Patent Document 3 can be applied to the n-layer side of a semiconductor junction, but cannot be applied to the p-layer side. Generally, heterojunction solar cells are known to have the highest characteristic of a configuration in which an n-type single crystalline silicon substrate is used and a heterojunction on the p-layer side is on the light incident side, and the method in Patent Document 3 has the problem that it is not suitable for formation of a collecting electrode on the light incident side in a heterojunction solar cell in which the p-layer side is on the light incident side. Further, in Patent Document 3, the side surface of a transparent electrode layer and a metal collecting electrode are in contact with each other in a groove extending through an insulating layer and the transparent electrode layer, but the contact area between the former and the latter is small because the thickness of the transparent electrode layer is generally about 100 nm. Therefore, there is the problem that the resistance between the transparent electrode and the collecting electrode increases, so that a function as a collecting electrode cannot be sufficiently exhibited.

In a method for preventing a short circuit and leakage between the front surface and the back surface by a method in which a mask is used or a method in which a groove is formed as in Patent Documents 4 to 6, a semiconductor layer and a transparent electrode layer on a silicon substrate are removed, so that the principal surface or the side surface of the silicon substrate is partially exposed. ITO or the like that is used as a material of a transparent electrode acts as a diffusion blocking layer that prevents diffusion of copper to a silicon substrate (for example Non-Patent Document 1). When a collecting electrode is formed by a plating method as disclosed in Patent Documents 1 to 3, metal components and the like in a plating solution may diffuse into the silicon substrate from an exposed area of the silicon substrate to adversely affect electrical characteristics.

As described above, a process for forming a collecting electrode using a plating method is excellent in terms of material costs and process costs, but in the previously proposed methods, it is difficult to form a low-resistance collecting electrode by a plating method without using a resist. For preventing a short circuit and leakage on the front and the back while preventing diffusion of metal components and the like in a plating solution into a silicon substrate, an effective solution has not been found yet.

An object of the present invention is to form a collecting electrode by a plating method capable of reducing material costs and process costs of a solar cell, and improve conversion efficiency of the solar cell by solving the problems described above.

Means for Solving the Problems

In view of the problems described above, the inventors have conducted extensive studies, and resultantly found that according to a specific configuration, a collecting electrode can be formed at low costs using a plating method while defects resulting from diffusion of metal components from a plating solution are suppressed, leading to the present invention.

That is, the present invention relates to a solar cell including a photoelectric conversion section and a collecting electrode, wherein the photoelectric conversion section has a first principal surface and a second principal surface, and the collecting electrode is formed on the first principal surface of the photoelectric conversion section. An outermost surface layer of the photoelectric conversion section on the first principal surface side is a semiconductor layer of a conductivity type or a transparent electrode layer. The collecting electrode includes a first electroconductive layer and a second electroconductive layer in this order from the photoelectric conversion section side, and includes an insulating layer between the first electroconductive layer and the second electroconductive layer. The insulating layer is provided with an opening, and the first electroconductive layer and the second electroconductive layer are in conduction with each other via the opening provided in the insulating layer.

The solar cell of the present invention has, on the first principal surface, the second principal surface or a side surface of photoelectric conversion section, an insulating region freed of a short circuit of components that form the outermost surface layer on the first principal surface side and components that form the outermost surface layer on the second principal surface side, and the surface of the insulating region is at least partially covered with the insulating layer. Preferably, the insulating region is provided on a region on the outer periphery with respect to the collecting electrode.

In a preferred aspect of the present invention, the insulating region is formed on the first principal surface or the side surface of the photoelectric conversion section, and the surface of the insulating region is at least partially covered with the insulating layer. In the aspect, preferably the insulating region is freed of a short circuit by having no deposition of components that form the outermost surface layer of the first principal surface. The "photoelectric conversion section" of the solar cell refers to a section where a semiconductor layer, an electrode formed of a metal or a metal oxide, and the like are stacked to generate photovoltaic power, and an insulating base such as a glass substrate to be used for stacking those layers is not included in the photoelectric conversion section.

Preferably, the insulating layer is also formed on a first electroconductive layer non-formed region in the first principal surface of the photoelectric conversion section. Preferably, the entire surface of the insulating region is covered with the insulating layer.

In a preferred aspect of the present invention, the outermost surface layer of the photoelectric conversion section on the first principal surface side is a transparent electrode layer. In one embodiment, the photoelectric conversion section has a silicon-based thin-film and a transparent electrode layer as an outermost surface layer in this order on one principal surface of a crystalline silicon substrate of a first conductivity-type, and a collecting electrode is provided on the transparent electrode layer.

In one embodiment, the first electroconductive layer contains a low-melting-point material, and the thermal fluidization onset temperature $T_1$ of the low-melting-point material is lower than the heat resistant temperature of the photoelectric conversion section. When the outermost surface layer of the photoelectric conversion section is a transparent electrode layer, the thermal fluidization onset temperature $T_1$ of the low-melting-point material is preferably 250° C. or less. Preferably, the low-melting-point material includes a metallic material.

In a preferred aspect of the present invention, the second electroconductive layer has copper as a main component.

Further, the present invention relates to a solar cell module including the solar cell.

Further, the present invention relates to a method of manufacturing the solar cell. The manufacturing method of the present invention includes: a first electroconductive layer forming step of forming a first electroconductive layer on a photoelectric conversion section; an insulating layer forming step of forming an insulating layer on the first electroconductive layer; and a plating step of forming a second electroconductive layer that is in conduction with the first electroconductive layer via an opening provided in the insulating layer, using a plating method, in this order.

In the manufacturing method of the present invention, preferably the insulating region is formed before the insulating layer forming step. Especially preferably, formation of the insulating region is performed after the first electroconductive layer forming step and before the insulating layer forming step. Preferably, the insulating region is at least partially covered with the insulating layer in the insulating layer forming step.

In a solar cell using a silicon substrate like a heterojunction solar cell, preferably the insulating region is formed so as to expose the silicon substrate. In one embodiment, formation of the insulating region is performed using a method of cleaving the photoelectric conversion section along a groove formed in the photoelectric conversion section.

Effects of the Invention

According to the present invention, a collecting electrode can be formed by a plating method, and therefore the collecting electrode is made less resistant, so that conversion efficiency of a solar cell can be improved. Since an insulating region is formed on a photoelectric conversion section, deterioration of conversion characteristics due to a short circuit is suppressed, and the insulating region is covered with an insulating layer, leading to excellent reliability of the solar cell. Further, when the collecting electrode is formed by a plating method, diffusion of impurities to a substrate is suppressed because the insulating layer is formed on the insulating region. Therefore, the solar cell of the present invention is excellent in initial conversion characteristics and also in reliability.

DESCRIPTION OF EMBODIMENTS

Figure 1:
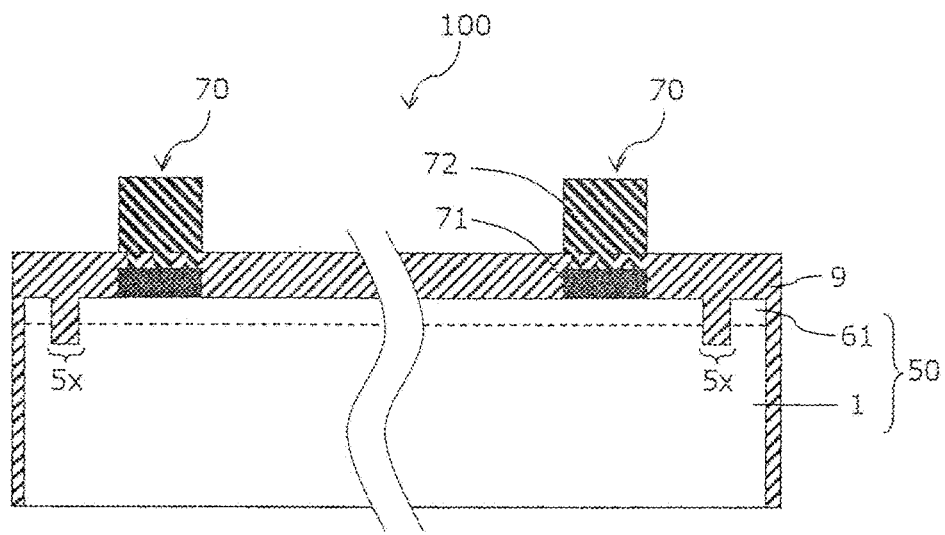
FIG. 1 is a schematic sectional view showing one embodiment of a solar cell of the present invention.

As schematically shown in FIG. 1, the solar cell 100 of the present invention includes a collecting electrode 70 on a first principal surface of a photoelectric conversion section 50. An outermost surface layer 61 of the photoelectric conversion section 50 is a semiconductor layer of a conductivity type or a transparent electrode layer. The collecting electrode 70 includes a first electroconductive layer 71 and a second electroconductive layer 72 in this order from the photoelectric conversion section 50 side. An insulating layer 9 is formed between the first electroconductive layer 71 and the second electroconductive layer 72. A part of the second electroconductive layer 72 is in conduction with the first electroconductive layer 71 via, for example, an opening provided in the insulating layer 9.

An insulating region 5x is formed on at least any one of the first principal surface, the second principal surface or a side surface of the photoelectric conversion section 50. The surface of the insulating region is at least partially covered with the insulating layer 9.

The present invention will be described more in detail below taking as an example a heterojunction crystalline silicon solar cell (hereinafter, referred to as a "heterojunction solar cell" in some cases) as one embodiment of the present invention. The heterojunction solar cell is a crystalline silicon-based solar cell in which a silicon-based thin-film having a band gap different from that of a single-crystalline silicon is formed on a surface of a crystalline silicon substrate of a first conductivity type to produce a diffusion potential. The silicon-based thin-film is preferably amorphous. Above all, a heterojunction solar cell having a thin intrinsic amorphous silicon layer interposed between a conductive amorphous silicon-based thin-film for forming a diffusion potential and a crystalline silicon substrate is known as one configuration of crystalline silicon solar cell with highest conversion-efficiency.

Figure 2:
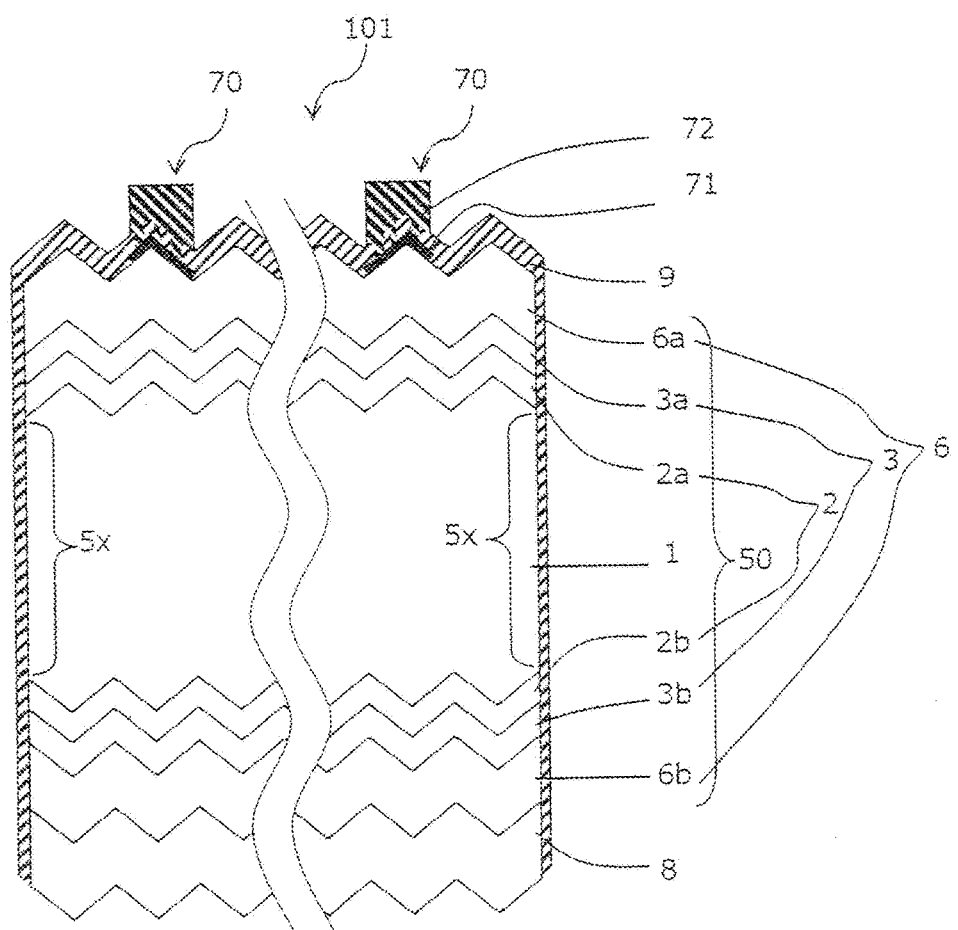
FIG. 2 is a schematic sectional view showing a heterojunction solar cell according to one embodiment.

FIG. 2 is a schematic sectional view of a crystalline silicon-based solar cell according to one embodiment of the present invention. A crystalline silicon-based solar cell 101 includes, as a photoelectric conversion section 50, a conductive silicon-based thin-film 3a and a light incident side transparent electrode layer 6a in this order on one surface (surface on the light incident side) of a single-crystalline silicon substrate 1 of a first conductivity type. A conductive silicon-based thin-film 3b and a back side transparent electrode layer 6b are preferably provided in this order on the other surface (surface opposite to the light incident side) of the single-crystalline silicon substrate 1 of the first conductivity type. An outermost surface layer of the photoelectric conversion section 50 on the first principal surface side is a transparent electrode layer 6a, and a collecting electrode 70 including a first electroconductive layer 71 and a second electroconductive layer 72 is formed on this transparent electrode layer. An insulating layer 9 is formed between the first electroconductive layer 71 and the second electroconductive layer 72.

In the embodiment shown in FIG. 2, an insulating region 5x freed of the silicon-based thin-film and the transparent electrode layer is provided on an side surface of the crystalline silicon substrate 1 which constitutes the photoelectric conversion section 50. The insulating region 5x is covered with the insulating layer 9.

Intrinsic silicon-based thin-films 2a and 2b are preferably provided between the single-crystalline silicon substrate 1 of the first conductivity type and the conductive silicon-based thin-films 3a and 3b. A back side metal electrode layer 8 is preferably provided on the back side transparent electrode layer 6b.

First, the single-crystalline silicon substrate 1 of the first conductivity type used in the crystalline silicon-based solar cell will be described. Generally, the single-crystalline silicon substrate contains impurities that supply charges to silicon for imparting conductivity. The single-crystalline silicon substrate is classified into an n-type which contains atoms for introducing electrons into silicon atoms (e.g. phosphorus) and a p-type which contains atoms for introducing holes into silicon atoms (e.g. boron). That is, the "first conductivity type" in the present invention means one of the n-type and the p-type.

In a heterojunction solar cell, electron/hole pairs can be efficiently separated and collected by setting a reverse junction as a heterojunction on the incident side at which light incident to the single-crystalline silicon substrate is absorbed most, thereby providing a strong electric field. Therefore, the heterojunction on the light incident side is preferably a reverse junction. When holes and electrons are compared, electrons, which are smaller in effective mass and scattering cross section, are generally larger in mobility. Accordingly, it is preferred that the crystalline silicon substrate 1 is an n-type single-crystalline silicon substrate. In order to enhance a light confinement, the single-crystalline silicon substrate preferably has textured structure in its surface.

A silicon-based thin-film is formed on the surface of the single-crystalline silicon substrate 1 of the first conductivity type on which a texture is formed. The method for forming these silicon-based thin-film layers is preferably plasma enhanced CVD. Conditions used for forming the silicon-based thin-film layers are preferably as follows: a substrate temperature of 100 to 300° C., a pressure of 20 to 2600 Pa, and a high-frequency power density of 0.004 to 0.8 W/cm$^2$. A source gas used to form the silicon-based thin-film layers may be a silicon-containing gas such as $SiH_4$ or $Si_2H_6$, or a mixed gas of silicon-based gas and $H_2$.

The conductive silicon-based thin-films 3 are silicon-based thin-film of the first conductivity type or an opposite conductivity type. For example, when an n-type single-crystalline silicon substrate is used as the single-crystalline silicon substrate 1 of the first conductivity type, the silicon-based thin-film of the first conductivity type and the silicon-based thin-film of the opposite conductivity type are n- and p-types, respectively. A dopant gas for forming the p-type layer or the n-type layer is preferably, for example, $B_2H_6$ or $PH_3$. The amount of impurity such as P or B added is sufficient to be a trace amount; thus, it is preferred to use a mixed gas wherein $B_2H_6$ or $PH_3$ is beforehand diluted with $SiH_4$ or $H_2$. When a gas containing a different element, such as $CH_4$, $CO_2$, $NH_3$ or $GeH_4$, is added thereto, silicon is alloyed so that the energy gaps of the conductive silicon-based thin-film layers can be changed.

Examples of the silicon-based thin-film include an amorphous silicon thin-film and microcrystalline silicon (a thin-film including amorphous silicon and crystalline silicon). Among them, an amorphous silicon-based thin-film is preferably used. When an n-type single-crystalline silicon substrate is used as the single-crystalline silicon substrate 1 of the first conductivity type, examples of the preferred structure of the photoelectric conversion section 50 include a stacked structure in the order of: transparent electrode layer 6a/p-type amorphous silicon-based thin-film 3a/i-type amorphous silicon-based thin-film 2a/n-type single-crystalline silicon substrate 1/i-type amorphous silicon-based thin-film 2b/n-type amorphous silicon-based thin-film 3b/transparent electrode layer 6b. In this case, for the aforementioned reason, the light incident surface is preferably on the p layer side.

The intrinsic silicon-based thin-films 2a and 2b are preferably i-type hydrogenated amorphous silicon composed of silicon and hydrogen. When i-type hydrogenated amorphous silicon is formed on a single-crystalline silicon substrate by a CVD method, surface passivation can be effectively performed while suppressing diffusion of impurities to the single-crystalline silicon substrate. When the amount of hydrogen in the film is changed along the thickness direction, the layer may have an energy gap profile effective for collecting carriers.

The p-type silicon-based thin-film is preferably a p-type hydrogenated amorphous silicon layer, a p-type amorphous silicon carbide layer or a p-type amorphous silicon oxide layer. The p-type hydrogenated amorphous silicon layer is preferable for suppressing impurity diffusion and reducing series resistance. On the other hand, the p-type amorphous silicon carbide layer and the p-type amorphous silicon oxide layer are wide-gap low-refractive index layers, and therefore preferable in the sense that the optical loss can be reduced.

The photoelectric conversion section 50 of the heterojunction solar cell 101 preferably includes transparent electrode layers 6a and 6b on the conductive silicon-based thin-films 3a and 3b. The transparent electrode layer is formed by a transparent electrode layer forming step. The transparent electrode layers 6a and 6b have a conductive oxide as a main component. As the conductive oxide, for example, zinc oxide, indium oxide and tin oxide may be used alone or in mixture thereof. From the viewpoints of electroconductivity, optical characteristics and long-term reliability, indium-based oxides including indium oxide are preferable. Among them, those having indium tin oxide (ITO) as a main component are more suitably used. Here, the wording "as a main component" means that the content is more than 50% by weight, preferably 70% by weight or more, more preferably 90% by weight or more. The transparent electrode layer may be a single layer or a layered structure composed of multiple layers.

A dopant can be added to the transparent electrode layer. For example, when zinc oxide is used for the transparent electrode layer, examples of the dopant include aluminum, gallium, boron, silicon and carbon. When indium oxide is used for the transparent electrode layer, examples of the dopant include zinc, tin, titanium, tungsten, molybdenum and silicon. When tin oxide is used for the transparent electrode layer, examples of the dopant include fluorine.

The dopant can be added to one or both of the light incident side transparent electrode layer 6a and the back side transparent electrode layer 6b. In particular, the dopant is preferably added to the light incident side transparent electrode layer 6a. By adding the dopant to the light incident side transparent electrode layer 6a, the transparent electrode layer itself is made less resistive, and the resistance loss between the transparent electrode layer 6a and the collecting electrode 70 can be suppressed.

The thickness of the light incident side transparent electrode layer 6a is preferably set to 10 nm or more and 140 nm or less, from the viewpoints of transparency, electroconductivity and reduction of light reflection. The role of the transparent electrode layer 6a is to transport carriers to the collecting electrode 70, and it suffices that the transparent electrode layer 6a has a level of electroconductivity required for this purpose, and the thickness of the transparent electrode layer 6a is preferably 10 nm or more. By ensuring that the thickness is 140 nm or less, the absorption loss at the transparent electrode layer 6a is kept low, so that a reduction in photoelectric conversion efficiency associated with a reduction in transmittance can be suppressed. When the thickness of the transparent electrode layer 6a falls within the aforementioned range, an increase in carrier concentration within the transparent electrode layer can also be prevented, and therefore a reduction in photoelectric conversion efficiency associated with a reduction in transmittance in an infrared range is also suppressed.

The method for forming a transparent electrode layer is not particularly limited, but a physical vapor deposition method such as a sputtering method, a chemical vapor deposition (MOCVD) method utilizing a reaction of an organic metal compound with oxygen or water, or the like is preferable. In any formation methods, energy from heat or plasma discharge may be utilized.

The substrate temperature during the deposition of the transparent electrode layer may appropriately set. For example, when an amorphous silicon-based thin-film is used as a silicon-based thin-film, the substrate temperature is preferably 200° C. or lower. By ensuring that the substrate temperature is 200° C. or lower, desorption of hydrogen from the amorphous silicon layer and associated generation of a dangling bond to a silicon atom can be suppressed, and as a result, conversion efficiency can be improved.

A back side metal electrode 8 is preferably formed on the back side transparent electrode layer 6b. For the back side metal electrode layer 8, it is desirable to use a material having a high reflectivity in a near-infrared to infrared range, and having high electroconductivity and chemical stability. Examples of the material satisfying these characteristics include silver and aluminum. The method for forming a back side metal electrode layer is not particularly limited, and a physical vapor deposition method such as a sputtering method or a vacuum vapor deposition method, a printing method such as screen printing, or the like is applicable.

Figure 3:
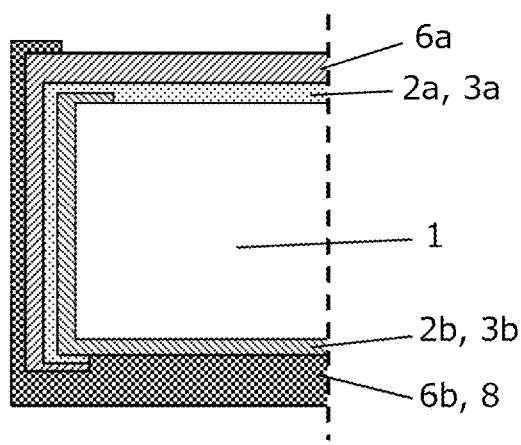
FIG. 3 is a schematic sectional view schematically showing a state in which silicon-based thin-films and electrode layers are formed without using a mask in a manufacturing process of a solar cell.

FIG. 3 is a sectional view schematically showing a state in which silicon-based thin-films 2 and 3; transparent electrode layers 6; and a back side metal electrode layer 8 are formed according to one embodiment. FIG. 3 schematically shows a structure when an intrinsic silicon-based thin-film 2b and a silicon-based thin-film 3b of the first conductivity type are formed on the back side of the single crystalline silicon substrate 1 of the first conductivity-type, an intrinsic silicon-based thin-film 2a and a silicon-based thin-film 3a of the opposite conductivity type are thereafter formed on the light incident side, and thereafter a transparent electrode layer 6a on the light incident side, and a transparent electrode layer 6b and the back side metal electrode layer 8 on the back side are formed (the order of formation of the layers of the crystalline silicon-based solar cell is not limited to the configuration shown in FIG. 3).

When the layers are formed by a CVD method, a sputtering method or the like without using a mask, the intrinsic silicon-based thin-film 2b, the silicon-based thin-film 3b of the first conductivity-type, the transparent electrode layer 6b and the back side metal electrode layer 8 on the back side of the single crystalline silicon substrate 1 of the first conductivity type extend to the side surface and the light incident surface of the crystalline silicon substrate 1 of the first conductivity type due to wraparound during deposition. The intrinsic silicon-based thin-film 2a, the silicon-based thin-film 3a of the opposite conductivity type and the transparent electrode layer 6a, which are formed on the light incident surface of the single crystalline silicon substrate 1 of the first conductivity-type, extend to the side surface and the back side of the single crystalline silicon substrate 1 of the first conductivity-type due to wraparound during deposition. When such wraparound occurs, the characteristics of the solar cell may be deteriorated as the semiconductor layer and the electrode layer on the front side and the semiconductor layer and the electrode layer on the back side are short circuited as is understood from FIG. 3.

In the present invention, the problem of short circuit resulting from wraparound can be solved by forming an insulating region freed of the outermost surface layer of the photoelectric conversion section. Here, in this description, the "insulating region" is a term that refers to one or more specific regions formed on the surface of the photoelectric conversion section, and means a region freed of a short circuit of the outermost surface layer on the first principal surface side and the outermost surface layer on the second principal surface side. Typically, the insulating region is a region which is freed of components forming the outermost surface layers of the first principal surface and/or the second principal surface of the photoelectric conversion section, and has no deposition of such components. The "region having no deposition" is not limited to a region from which material elements forming the concerned layer are not detected at all, and a region, in which the deposition of the material is remarkably low as compared to neighboring "formation sections", and characteristics (electrical characteristics, optical characteristics, mechanical characteristics and so on) of the concerned layer itself are not exhibited, is also encompassed in the "region having no deposition". In the case of the heterojunction solar cell shown in FIG. 2, preferably the insulating region has no deposition of the transparent electrode layers 6 as an outermost surface layer of the photoelectric conversion section and the back side metal electrode layer 8, and also no deposition of the silicon-based thin-films 3 of a conductivity type.

The method for formation of the insulating region is not particularly limited, and examples thereof include a method in which when an electrode layer, a semiconductor thin-film and the like are formed, a mask or the like is used to prevent deposition of the electrode layer, the semiconductor thin-film and the like on a predetermined region; a method in which an electrode layer, a semiconductor thin-film and the like on a predetermined region are removed by laser irradiation, mechanical polishing, chemical etching or the like; and a method in which after the layers are formed, the end portion is cleaved off together with a substrate to form a cut surface on which an electrode layer, a semiconductor thin-film and the like are not deposited.

Figure 4:
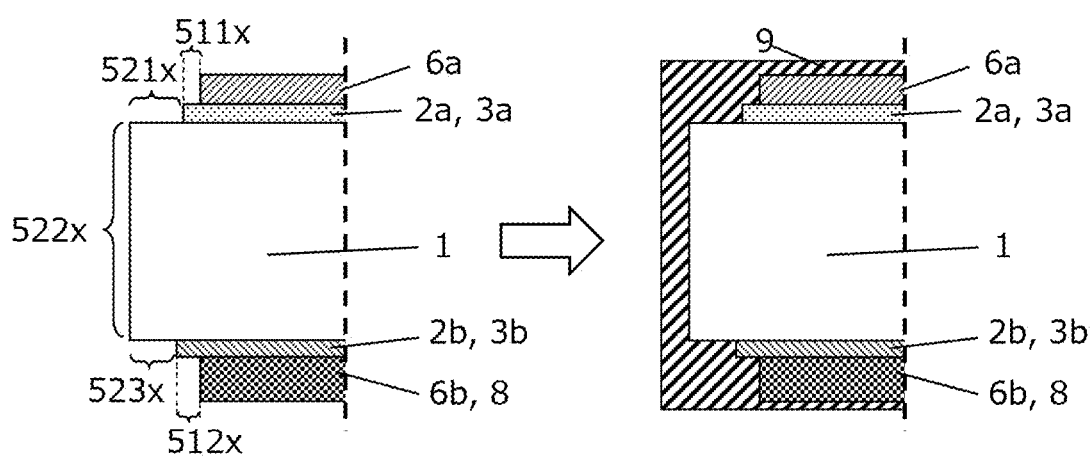
FIG. 4 is a series of schematic sectional views showing a process of manufacturing one embodiment of a solar cell.

FIG. 4 illustrates at step 4A1 a schematic sectional view showing one example where an insulating region having no deposition of an electrode layer, a semiconductor thin-film and the like is formed using a mask. In the embodiment, a transparent electrode layer, a semiconductor thin-film and the like can be prevented from wrapping around to the outer peripheral portion (deposition surface side) of a crystalline silicon substrate, the side surface and the opposite side to the deposition surface by using a mask for shielding the outer peripheral portion of the crystalline silicon substrate when the transparent electrode layer, the semiconductor thin-film and the like are formed. In the embodiment, the transparent electrode layer and the silicon-based thin-film of a conductivity type are separated between the light incident side and the back side, and therefore a short circuit of the light incident side and the back side can be prevented.

In the embodiment shown in FIG. 4 at step 4A1, different masks are used in the shielding region during formation of the silicon-based thin-films 2 and 3 and during formation of the transparent electrode layers 6 and the back side metal electrode layer 8, so that a transparent electrode layer-removed region 511$x$, on which the transparent electrode layer 6$a$ is not deposited, is formed on the first principal surface side that is the light incident side. Similarly, a transparent electrode layer-removed region 512$x$, on which the transparent electrode layer 6$b$ and the back side metal electrode layer 8 are not deposited, is formed on the second principal surface side. Further, conductive semiconductor layer-removed regions 521$x$, 522$x$ and 523$x$, on which neither of the transparent electrode layers and the silicon-based thin-films are formed, are formed on the outside of the transparent electrode layer-removed regions and on the side surface of the crystalline silicon substrate. In this way, the shape of the insulating region can be appropriately changed according to the shape of a mask, or the like.

FIG. 4 illustrates at step B1 a schematic sectional view showing another embodiment where an insulating region having no deposition of a transparent electrode layer, a semiconductor thin-film and the like is formed using a mask. In this embodiment, a mask is not used during formation of the silicon-based thin-films 2 and 3, and a mask is used during formation of the transparent electrode layers 6 and the back side metal electrode layer 8. Accordingly, silicon-based thin-films 3$a$ and 3$b$ of a conductivity type are short circuited on the front side and the back side of the crystalline silicon substrate 1, but transparent electrode layer-removed regions 513$x$, 514$x$ and 515$x$, on which the transparent electrode layers that are the outermost surface layers, and the back side metal electrode layer are not deposited, are formed, and therefore a short circuit of the transparent electrode layers 6 does not occur.

FIG. 4 illustrates at step C1 a schematic sectional view showing another embodiment in which an insulating region having no deposition of a transparent electrode layer, a semiconductor thin-film and the like is formed using a mask. In this embodiment, different masks are used in the shielding region during formation of the silicon-based thin-films 2 and 3 and during formation of the transparent electrode layers 6 and the back side metal electrode layer 8, so that a conductivity type layer-removed region 501$x$, on which the silicon-based thin-film 3$a$ of a conductivity type is not deposited, is formed on the first principal surface side that is the light incident side. Similarly, a conductivity type layer-removed region 502$x$, on which the silicon-based thin-film 3$b$ of a conductivity type is not deposited, is formed on the second principal surface side. Further, conductivity type semiconductor layer-removed regions 524$x$, 525$x$ and 526$x$, on which neither of the transparent electrode layers and the silicon-based thin-films are deposited, are formed on the outside of the conductivity type layer-removed regions and on the side surface of the crystalline silicon substrate.

Figure 5:
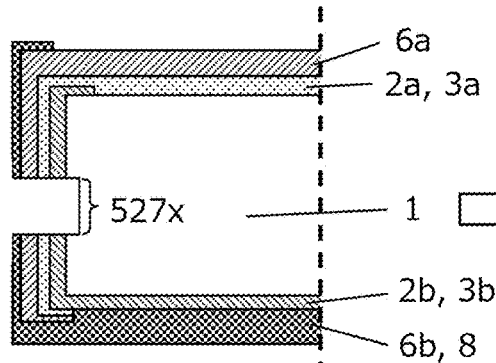
FIG. 5 is a series of schematic sectional views showing a process of manufacturing one embodiment of a solar cell.
Figure 5:
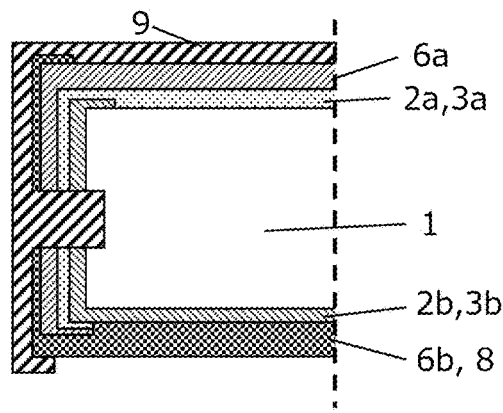
Figure 5:
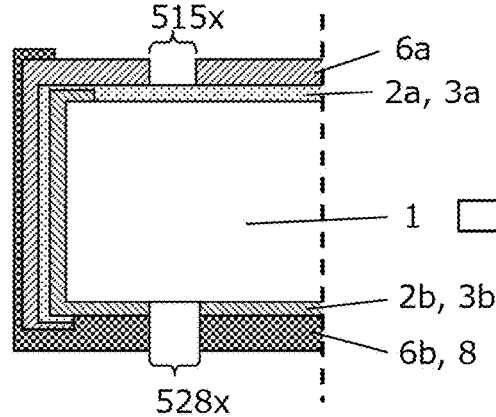
Figure 5:
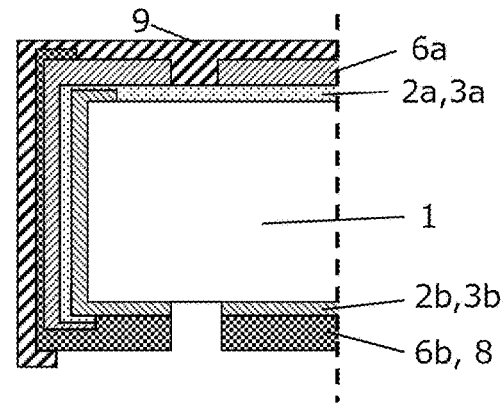

FIG. 5 illustrates at steps A1 and B1 respectively schematic sectional views showing an example where an insulating region is formed after a semiconductor thin-film and a transparent electrode layer are formed. In FIG. 5 at step A1, a conductivity type semiconductor layer-removed region 527$x$ freed of the transparent electrode layers 6 and the silicon-based thin-films 2 and 3 is formed on the side surface of the silicon substrate 1. In FIG. 5 at step B1, a transparent electrode layer-removed region 515$x$ freed of the transparent electrode layer 6$a$ is formed on the first principal surface side that is the light incident side, and a conductivity type semiconductor layer-removed region 528$x$ freed of the back side metal electrode layer 8, the transparent electrode layer 6$b$, and the silicon-based thin-films 2$b$ and 3$b$, is formed on the second principal surface side.

These insulating regions are formed by removing a transparent electrode layer, a semiconductor thin-film and the like which are deposited on a predetermined region using laser irradiation, mechanical polishing, chemical etching or the like after the layers are formed. In these thin-film-removed regions, the silicon substrate 1 may be partially chipped away. For example, when a transparent electrode layer, a semiconductor thin-film and the like are removed by laser irradiation, generally a groove extending to the inside of the silicon substrate 1 is formed as in the conductivity type semiconductor layer-removed region 527$x$ shown in FIG. 5 at step 5A1 and the conductivity type semiconductor layer-removed region 529$x$ shown in FIG. 6 at step 6A1.

An insulating region (cut surface) having no deposition of an electrode layer, a semiconductor thin-film and the like can also be formed by a method in which the end portion is cleaved off together with a substrate after layers such as a transparent electrode layer and a semiconductor thin-film are formed. Examples of the method for forming a cut surface by cleaving the end portion together with a substrate include a method in which the end portion of a substrate is cleaved off and removed using a scrubber, a dicing saw or the like. Preferably, a method is used in which a groove is formed on the surface of a substrate, and the substrate is bent and cleaved with the groove as the cleavage center.

Figure 6:
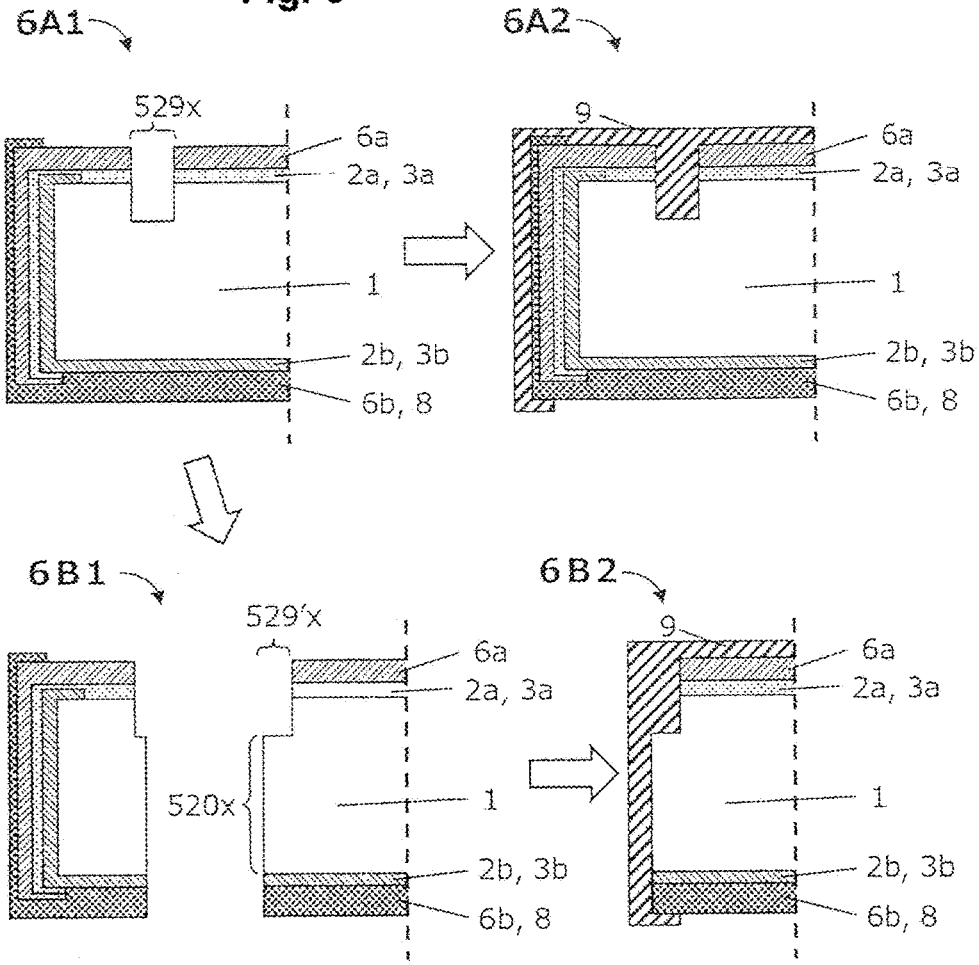
FIG. 6 is a series of schematic sectional views showing a process of manufacturing one embodiment of a solar cell.

FIG. 6 at step 6A1 and 6 at step 6B1 are drawings schematically showing a process where a substrate is bent and cleaved with a groove 529$x$ as the cleavage center. First, the groove 529$x$ is formed on the principal surface of the silicon substrate 1 as shown in FIG. 6 at step 6A1. Although the method for forming a groove is not particularly limited, laser light irradiation is preferable.

As a laser for forming such a groove, one having power sufficient to form the groove 529$x$ at a wavelength of light capable of being absorbed by a crystalline silicon substrate can be applied. For example, a UV laser having a wavelength of 400 nm or less, such as a third harmonic of a YAG laser or an Ar laser, is preferable, and the laser power is preferably about 1 to 20 W. The optical diameter of laser light to be used may be, for example, 20 to 200 μm. By irradiation of laser light in the above-described conditions, the groove 529$x$ having substantially the same width as the optical diameter of laser light can be formed. The depth of the groove can be appropriately set to a depth at which the substrate is easily divided along the groove.

The groove 529$x$ thus formed is set as the cleavage center, and the silicon substrate 1 is cleaved therealong. Examples of the cleavage method include a method in which a silicon substrate is bent while the peripheral portion thereof (outer side of groove) is held by a holding member. Generally, a crystalline silicon substrate is cut out so as to have a predetermined crystal orientation surface. Therefore the silicon substrate can be easily cleaved along a direction perpendicular to the substrate surface, as long as a groove as an origination point for cleavage is formed. By cleaving the substrate in this manner, a cut surface 520x having no deposition of a transparent electrode layer, a semiconductor thin-film and the like can be formed as shown in FIG. 6 at step 6B1.

As described above, the insulating region may be any of the transparent electrode layer-removed regions 511x to 515x having substantially no deposition of a transparent electroconductive layer and the conductivity type semiconductor layer-removed regions 520x to 529x having no deposition of a transparent electrode layer and also a semiconductor layer of a conductivity type. In the explanatory example described above, the silicon-based thin-films 3a and 3b of a conductivity type and also the intrinsic silicon-based thin-films 2a and 2b are removed, but the conductivity type semiconductor layer-removed region does not have to be freed of the intrinsic silicon-based thin-film. The conductivity type semiconductor layer-removed region may extend to the inside of the silicon substrate 1 as illustrated as regions 527x and 529x.

The insulating region may be, for example, the region 528x which is freed of a back side metal electrode layer and has substantially no deposition thereof as shown in FIG. 5 at step B1. When the transparent electrode layers 6 are formed on the semiconductor layers 3 of a conductivity type as in a heterojunction solar cell, preferably the insulating region is formed so as to be freed of both the transparent electrode layer and the semiconductor layer of a conductivity type for further improving the short circuit prevention effect.

The insulating region may be formed on either of the principal surface and the side surface of the substrate. When the insulating region is formed on the principal surface of the substrate, the insulating region may be formed only on one surface, or may be formed on both surfaces. The number and shape of insulating regions are not particularly limited, but preferably the insulating region is formed so that a short circuit on the front and the back can be reliably eliminated for achieving improved solar cell performance.

Preferably the insulating region is provided on a region on the outer periphery with respect to a collecting electrode 70 for improving solar cell performance. Particularly, for increasing the effective power generation area, the insulating region is preferably provided at a position closer to the end portion of the first principal surface and/or the second principal surface (for example, a region at a distance of 5 mm or less from the end portion), and especially preferably the insulating region is provided on the side surface of the substrate.

As described in detail later, in the present invention, the insulating layer is formed on the insulating region, so that diffusion of impurities to the substrate is suppressed when the collecting electrode is formed by a plating method. Therefore, the insulating region is preferably provided in such a position and shape that its surface is coated during formation of the insulating layer. From such a viewpoint, the insulating region is preferably provided on a surface on a side at which the insulating layer is formed, i.e. on the first principal surface side. Even when the insulating region is provided on the side surface, the surface of the insulating region can be covered with the insulating layer due to wraparound during formation of the insulating layer. When the insulating region is provided on the second principal surface side, the insulating region is preferably provided at a position closer to the end portion of the second principal surface. When the insulating region is provided at a position closer to the end portion of the second principal surface, the insulating layer 9 can be formed on the insulating region due to wraparound to the back surface at the time of forming the insulating layer 9 on the first principal surface side (see, for example, FIG. 4 at step 4C2.

Among the methods for forming an insulating region, the method of cleaving a substrate is especially preferable from the viewpoint of productivity and for reliably eliminating a short circuit. As described later, the cut surface of the substrate is covered with the insulating layer 9, so that a leak current is prevented, a short circuit at the time of connecting an interconnector such as a TAB for modularization can be efficiently inhibited, and a modularization step can be simplified.

The collecting electrode 70 is formed on the first principal surface of the photoelectric conversion section formed in the manner described above. In an embodiment of the heterojunction solar cell shown in FIG. 2, the collecting electrode 70 is formed on the transparent electrode layer 6a on the light incident side. The collecting electrode 70 includes a first electroconductive layer 71 and a second electroconductive layer 72.

The insulating layer 9 is formed between the first electroconductive layer 71 and the second electroconductive layer 72. In the collecting electrode 70, a part of the second electroconductive layer 72 is conductively connected with the first electroconductive layer 71. Here, the wording "a part of . . . is conductively connected with . . . " typically refers to a state in which a conductive connection is established by forming an opening section in the insulating layer and filling the opening section with a material of the second electroconductive layer. In addition, a state is also included in which the thickness of a part of the insulating layer 9 is very small, i.e. only several nanometers, and resultantly the second electroconductive layer 72 is conductively connected with the first electroconductive layer 71. For example, when the first electroconductive layer 71 includes a low-melting-point metallic material such as aluminum, mention is made of a state in which a conductive connection is established between the first electroconductive layer 71 and the second electroconductive layer via an oxide covering formed on the surface of the first electroconductive layer.

The method for forming in the insulating layer 9 an opening conductively connecting the first electroconductive layer and the second electroconductive layer with each other is not particularly limited, and a method such as laser irradiation, mechanical drilling or chemical etching may be employed. In one embodiment, a method is used in which a low-melting-point material in the first electroconductive layer is thermally fluidized to form an opening in an insulating layer formed thereon.

Examples of the method for forming an opening by thermal fluidization of a low-melting-point material in the first electroconductive layer include a method in which the insulating layer 9 is formed on the first electroconductive layer 71 containing a low-melting-point material, and heating (annealing) is carried out to a temperature equal to or higher than a thermal fluidization onset temperature $T_1$ of the low-melting-point material to change the surface shape of the first electroconductive layer, so that an opening (crack) is formed in the insulating layer 9 formed on the first electroconductive layer; and a method in which when the insulating layer 9 is formed on the first electroconductive layer 71 containing a low-melting-point material, heating is carried out to a temperature equal to or higher than the temperature $T_1$ to thermally fluidize the low-melting-point material, so that an opening is formed simultaneously with formation of the insulating layer.

Figure 7:
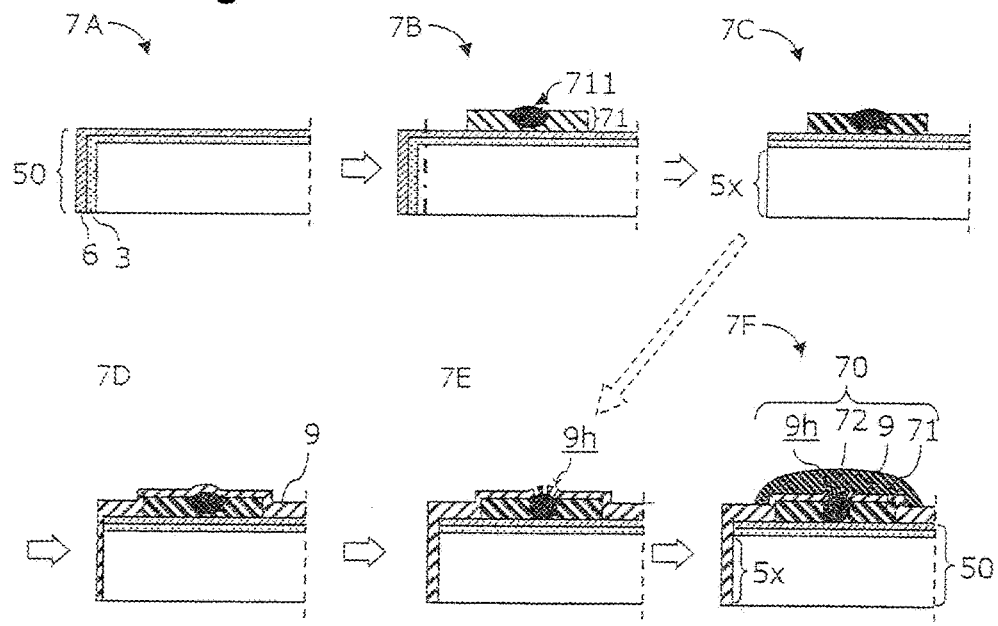
FIG. 7 is a series of schematic sectional views showing a process of manufacturing one embodiment of a solar cell.

A method for forming an opening in the insulating layer using thermal fluidization of a low-melting-point material in the first electroconductive layer will be described below with reference to the drawings. FIG. 7 is a schematic procedural view showing one embodiment of a method for forming a collecting electrode 70 on a photoelectric conversion section 50 of a solar cell. In the embodiment illustrated in FIG. 7, first, the photoelectric conversion section 50 is provided (a photoelectric conversion section providing step; FIG. 7 at step 7A). For example, in the case of a heterojunction solar cell, a photoelectric conversion section including a silicon-based thin-film and a transparent electrode layer is provided on a silicon substrate of a first conductivity type, as described above.

A first electroconductive layer 71 containing a low-melting-point material 711 is formed on one principal surface of the photoelectric conversion section (a first electroconductive layer forming step; FIG. 7 at step 7B). Thereafter, an insulating region is formed on the photoelectric conversion section (FIG. 7 at step 7C). FIG. 7 at step 7C illustrates an example of formation of an insulating region by a method of cleaving a substrate. After the insulating region is formed, the insulating layer 9 is formed on the first electroconductive layer 71 (insulating layer forming step; FIG. 7 at step 7D). The insulating layer 9 may be formed only on the first electroconductive layer 71, or may be formed also on a region on which no first electroconductive layer 71 is formed (first electroconductive layer-non-formed region) in the photoelectric conversion section 50. In particular, when a transparent electrode layer is formed on the surface of the photoelectric conversion section 50 as in the heterojunction solar cell, the insulating layer 9 is preferably formed also on the first electroconductive layer-non-formed region. In the present invention, it is preferable that in this insulating layer forming step, the insulating layer 9 is also formed on the insulating region 5x formed in the insulating region forming step in FIG. 7 at step 7C.

After the insulating layer 9 is formed, annealing is carried out by heating (an annealing step; FIG. 7 at step 7E). The first electroconductive layer 71 is heated to an annealing temperature Ta in the annealing step, so that the low-melting-point material is thermally fluidized to thereby change the surface shape, and accordingly the insulating layer 9 formed on the first electroconductive layer 71 is deformed. Typically, deformation of the insulating layer 9 results in formation of an opening section 9h in the insulating layer. The opening section 9h is formed in the form of, for example, cracks.

After carrying out the annealing, a second electroconductive layer 72 is formed by a plating method (a plating step; FIG. 7 at step 7F). The first electroconductive layer 71 is covered with the insulating layer 9, but in a section, where the opening section 9h is formed in the insulating layer 9, the first electroconductive layer 71 is exposed. Therefore, the first electroconductive layer is exposed to plating solution, so that metal can be deposited at the opening section 9h forming an origination point. According to this method, a second electroconductive layer matching the shape of the collecting electrode can be formed by a plating method without providing a resist material layer having an opening section matching the shape of the collecting electrode. Further, since the insulating region 5x freed of a transparent electrode layer, a silicon-based thin-film and the like to expose the silicon substrate 1 is covered with the insulating layer 9 in advance, impurities that may cause deterioration of solar cell characteristics (e.g. copper ions etc.) can be prevented from diffusing to the crystalline silicon substrate from the insulating region 5x in the plating step.

FIG. 7 illustrates a method of forming the insulating region 5x by cleaving the crystalline silicon substrate 1 after formation of the first electroconductive layer, but the insulating region 5x may be formed in any of the stages before the insulating layer forming step. For example, the insulating region 5x may be formed after formation of the transparent electrode layer 6a and before formation of the first electroconductive layer. When the back side metal layer 8 is formed as shown in FIG. 2, the insulating region 5x may be formed either before or after formation of the back side metal layer 8. When the insulating region forming step is performed before the insulating layer forming step, the insulating region 5x can be easily covered with the insulating layer 9.

The insulating region forming step is performed more preferably after the first electroconductive layer forming step, and especially preferably immediately before the insulating layer forming step. Since formation of the insulating region is performed immediately before formation of the insulating layer 9, the time until formation of the insulating layer after formation of the insulating region can be reduced, and therefore ingress of impurities into the crystalline silicon substrate can be more effectively suppressed, so that a solar cell having higher performance is easily manufactured.

The first electroconductive layer 71 is a layer that functions as an electroconductive underlying layer when the second electroconductive layer is formed by a plating method. Therefore, it suffices that the first electroconductive layer has such a level of electroconductivity that it can function as an underlying layer for electrolytic plating. In this specification, those having a volume resistivity of $10^{-2}$ $\Omega \cdot cm$ or less are defined as being electroconductive. Those having a volume resistivity of $10^2$ $\Omega \cdot cm$ or more are defined as insulating.

The thickness of the first electroconductive layer 71 is preferably 20 μm or less, more preferably 10 μm or less, in terms of costs. On the other hand, the thickness is preferably 0.5 μm or more, more preferably 1 μm or more, so that the line resistance of the first electroconductive layer 71 falls within a desired range.

In the embodiment illustrated in FIG. 7, the first electroconductive layer 71 contains a low-melting-point material having a thermal-fluidization onset temperature $T_1$. The thermal-fluidization onset temperature is a temperature at which a material is fluidized by heating to change the surface shape of a layer containing a low-melting-point material, and is typically a melting point. As for polymer materials and glass, a material may be softened to be thermally fluidized at a temperature lower than the melting point. In these materials, the thermal-fluidization onset temperature can be defined as being equal to a softening point. The softening point is a temperature at which the viscosity is $4.5 \times 10^6$ Pa·s (same as the definition for the softening point of glass).

The low-melting-point material is preferably thermally fluidized in the annealing step, thus causing a change in surface shape of the first electroconductive layer 71. Therefore, the thermal-fluidization onset temperature $T_1$ of the low-melting-point material is preferably lower than an annealing temperature Ta. In the present invention, the annealing step is preferably carried out at the annealing temperature Ta that is lower than the heat-resistant temperature of the photoelectric conversion section 50. Therefore, the thermal-fluidization onset temperature $T_1$ of the lowmelting-point material is preferably lower than the heat-resistant temperature of the photoelectric conversion section.

The heat-resistant temperature of the photoelectric conversion section is a temperature at which characteristics of a solar cell module prepared using a solar cell (also referred to as a "solar cell" or a "cell") or a solar cell including the photoelectric conversion section are irreversibly reduced. For example, in the heterojunction solar cell 101 shown in FIG. 2, the single-crystalline silicon substrate 1 that forms the photoelectric conversion section 50 hardly undergoes a change in characteristics even when heated to a high temperature of 500° C. or higher, but the transparent electrode layers 6 and amorphous silicon-based thin-films 2 and 3 may undergo thermal degradation or diffusion of dope impurities when heated to about 250° C., thus causing an irreversible reduction in the solar cell characteristics. Therefore, in the heterojunction solar cell, the first electroconductive layer 71 preferably contains a low-melting-point material having a thermal-fluidization onset temperature $T_1$ of 250° C. or lower.

The lower limit of the thermal-fluidization onset temperature $T_1$ of the low-melting-point material is not particularly limited. The low-melting-point material is preferably not thermally fluidized in the step of forming the first electroconductive layer, so that an amount of surface shape change of the first electroconductive layer in the annealing step is increased to form the opening section 9h in the insulating layer 9 easily. For example, when the first electroconductive layer is formed by coating or printing, heating may be carried out for drying. In this case, the thermal-fluidization onset temperature $T_1$ of the low-melting-point material is preferably higher than the temperature of heating for drying the first electroconductive layer. Accordingly, the thermal-fluidization onset temperature $T_1$ of the low-melting-point material is preferably 80° C. or higher, more preferably 100° C. or higher.

The low-melting-point material may be an organic substance or an inorganic substance as long as the thermal-fluidization onset temperature $T_1$ falls within the aforementioned range. The low-melting-point material may be electroconductive or insulating, but is desired to be a metallic material that has electroconductivity. If the low-melting-point material is a metallic material, the resistance value of the first electroconductive layer can be decreased, so that uniformity of the thickness of the second electroconductive layer can be improved when the second electroconductive layer is formed by electroplating. If the low-melting-point material is a metallic material, the contact resistance between the photoelectric conversion section 50 and the collecting electrode 70 can also be reduced.

As the low-melting-point material, a low-melting metallic material alone or an alloy thereof, or a mixture of a plurality of low-melting metallic materials can be suitably used. Examples of the low-melting metallic material include indium, bismuth and gallium.

Figure 8:
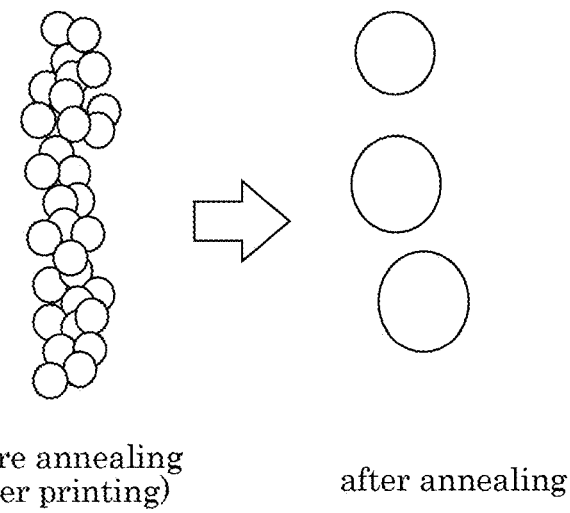
FIG. 8 is a conceptual view showing one example of a shape change of a low-melting-point material during heating.

The first electroconductive layer 71 preferably contains, in addition to the aforementioned low-melting-point material, high-melting-point material having thermal-fluidization onset temperature $T_2$ that is relatively higher than the thermal-fluidization onset temperature of the low-melting-point material. When the first electroconductive layer 71 includes a high-melting-point material, a conductive connection can be efficiently established between the first electroconductive layer and the second electroconductive layer, so that conversion efficiency of the solar cell can be improved. For example, when a material with high surface energy is used as the low-melting-point material, the first electroconductive layer 71 is exposed to a high temperature in the annealing step, the low-melting-point material is thereby brought into liquid phase state and as a result, as shown conceptually in FIG. 8, particles of the low-melting-point material aggregate into coarse particles, so that disconnecting occurs in the first electroconductive layer 71 in some cases. In contrast, the high-melting-point material is not brought into a liquid phase state by heating in the annealing step, and therefore by including the high-melting-point material in the first electroconductive layer forming material, disconnecting of the first electroconductive layer by coarsening of the low-melting-point material as shown in FIG. 8 can be suppressed.

The thermal-fluidization onset temperature $T_2$ of the high-melting-point material is preferably higher than the annealing temperature Ta. That is, when the first electroconductive layer 71 contains the low-melting-point material and the high-melting-point material, the thermal-fluidization onset temperature $T_1$ of the low-melting-point material, the thermal-fluidization onset temperature $T_2$ of the high-melting-point material and the annealing temperature Ta in the annealing step preferably satisfy $T_1<Ta<T_2$. The high-melting-point material may be an insulating material or an electroconductive material, but is preferably an electroconductive material in order to reduce the resistance of the first electroconductive layer. When the electroconductivity of the low-melting-point material is low, the overall resistance of the first electroconductive layer can be reduced by using a material having high electroconductivity as the high-melting-point material. As the electroconductive high-melting-point material, for example, a metallic material alone such as silver, aluminum or copper, or a plurality of metallic materials can be suitably used.

When the first electroconductive layer 71 contains the low-melting-point material and the high-melting-point material, the content ratio thereof is appropriately adjusted from the viewpoints of suppression of disconnecting by coarsening of the low-melting-point material as described above, the electroconductivity of the first electroconductive layer, ease of forming an opening section in the insulating layer (increase of the number of origination points for metal deposition on the second electroconductive layer), and so on. The optimum value of the content ratio varies depending on combinations of materials and particle sizes used, but for example, the weight ratio between the low-melting-point material and the high-melting-point material (low-melting-point material:high-melting-point material) is set in a range from 5:95 to 67:33. The weight ratio between the low-melting-point material:the high-melting-point material is more preferably set from 10:90 to 50:50, further preferably set to from 15:85 to 35:65.

When a particulate low-melting-point material such as metal particles is used as a material of the first electroconductive layer 71, the particle size $D_L$ of the low-melting-point material is preferably no less than 1/20, more preferably no less than 1/10, of the thickness d of the first electroconductive layer, so that a formation of an opening in the insulating layer in the annealing step is facilitated. The particle size $D_L$ of the low-melting-point material is preferably 0.25 µm or more, more preferably 0.5 µm or more. When the first electroconductive layer 71 is formed by a printing method such as screen printing, the particle size of particles can be appropriately set according to, for example, the mesh size of a screen plate. For example, the particle size is preferably smaller than the mesh size, more preferably no more than ½ of the mesh size. When particles are non-spherical, the particle size is defined by the diameter of a circle having an area equal to the projected area of particles (projected area-circle equivalent diameter, Heywood diameter).

The shape of particles of the low-melting-point material is not particularly limited, but is preferably a non-spherical shape such as a flat shape. Non-spherical particles formed by binding spherical particles together by a method such as sintering are also suitably used. In general, when metal particles are brought into a liquid phase state, the surface shape tends to be spherical for reducing surface energy. If the low-melting-point material of the first electroconductive layer before carrying out the annealing step is non-spherical, the amount of change in surface shape of the first electroconductive layer is larger because particles become more spherical when heated to the thermal-fluidization onset temperature $T_1$ or higher in the annealing step. Therefore, it becomes easy to form an opening section in the insulating layer 9 on the first electroconductive layer 71.

As described above, the first electroconductive layer 71 exhibits electroconductivity, and it suffices that its volume resistivity is $10^{-2}$ Ω·cm or less. The volume resistivity of the first electroconductive layer 71 is preferably $10^{-4}$ Ω·cm or less. When the first electroconductive layer has only the low-melting-point material, it suffices that the low-melting-point material has electroconductivity. When the first electroconductive layer contains the low-melting-point material and the high-melting-point material, it suffices that at least either one of the low-melting-point material and the high-melting-point material is electroconductive. Examples of the combination of the low-melting-point material/high-melting-point material include: insulating material/electroconductive material; electroconductive material/insulating material; and electroconductive material/electroconductive material. In order to make the first electroconductive layer less resistive, it is preferable that both the low-melting-point material and high-melting-point material be electroconductive materials.

Besides using the combination of the low-melting-point material and the high-melting-point material described above as the material of the first electroconductive layer 71, conversion efficiency may also be improved by adjusting the size of materials (e.g. particle size) and the like to suppress the disconnecting of the first electroconductive layer due to heating in the annealing step. For example, even a material having a high melting point, e.g. silver, copper or gold, in the form of fine particles having a particle size of 1 μm or less, undergoes sintering-necking (fusion of fine particles) at a temperature lower than the melting point, i.e. about 200° C., or a lower temperature $T_1'$, and therefore can be used as the "low-melting-point material" of the present invention. When heated to the sintering-necking onset temperature $T_1'$ or higher, the material that undergoes sintering-necking is deformed at and near the outer periphery of fine particles, so that the surface shape of the first electroconductive layer can be changed to form an opening section in the insulating layer 9. Even when fine particles are heated to the sintering-necking onset temperature or higher, the fine particles retains a solid phase state at any temperature that is lower than a melting point $T_2'$, and therefore disconnecting by coarsening of the material as shown in FIG. 8 hardly occurs. In this respect, it can be said that the material that undergoes sintering-necking, such as metal fine particles, has an aspect of the "high-melting-point material" as well while being the "low-melting-point material" in the present invention.

Figure 9A:
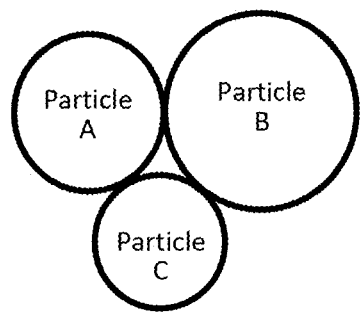
FIGS. 9(A), 9(B), and 9(C) are conceptual views for explaining a shape change and necking of a low-melting-point material powder during heating.
Figure 9B:
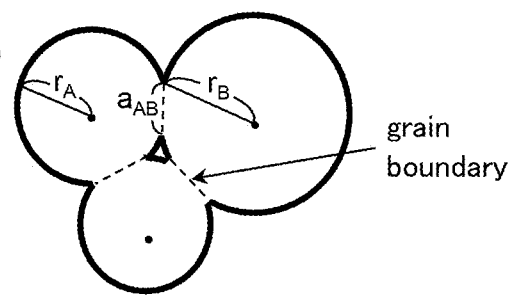
Figure 9C:
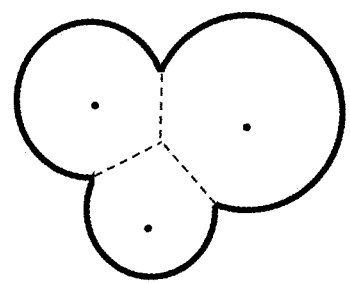

In the material that undergoes sintering-necking, the sintering-necking onset temperature $T_1'$ can be defined as being equal to a thermal-fluidization onset temperature $T_1$. FIGS. 9(A)-9(C) are views for explaining the sintering-necking onset temperature. FIG. 9(A) is a plan view schematically showing particles before sintering. Particles contact one another at points because they are particles before sintering. FIGS. 9(B) and 9(C) are sectional views each schematically showing a state when particles after the onset of sintering are cut along a cross section that passes through the center of each particle. FIG. 9(B) shows particles after the onset of sintering (initial sintering stage), and FIG. 9(C) shows a state in which the particles of FIG. 9(B) are further sintered. In FIG. 9(B), the grain boundary between a particle A (radius: $r_A$) and a particle B (radius: $r_B$) is shown by a dotted line segment (length: $a_{AB}$).

Figure 10A:
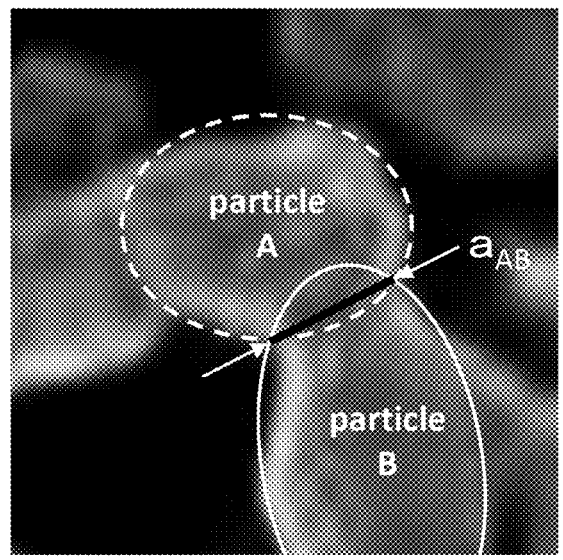
FIGS. 10(A) and 10(B) are SEM photographs of metal fine particles in which sintering-necking occurs.
Figure 10B:
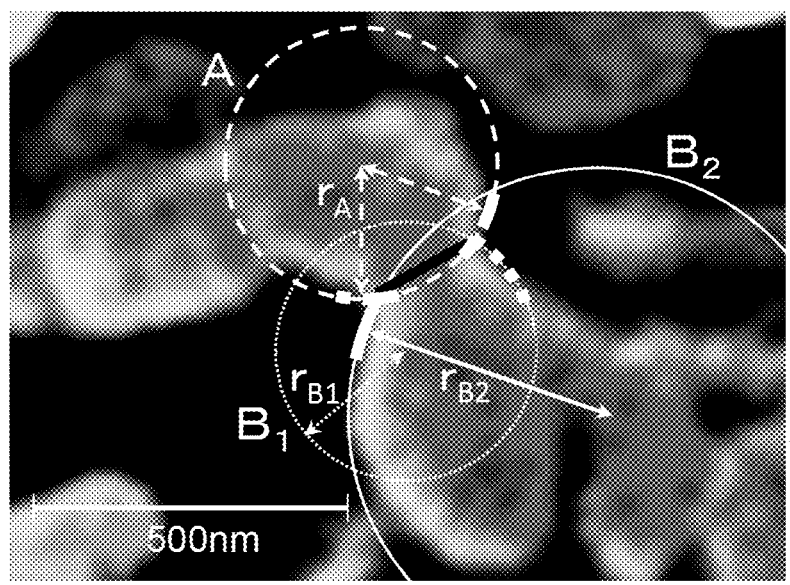

The sintering-necking onset temperature $T_1'$ is defined by a temperature at which the ratio of the length $a_{AB}$ of the grain boundary to max $(r_A, r_B)$, that is the larger of $r_A$ and $r_B$, $a_{AB}/\max(r_A, r_B)$, is 0.1 or more. That is, the temperature, at which $a_{AB}/\max(r_A, r_B)$ of at least a pair of particles is 0.1 or more, is referred to as a sintering-necking onset temperature. In FIGS. 9(A)-9(C), particles are shown as being spherical for simplification, but when particles are not spherical, the curvature radius of a particle near the grain boundary is considered as the radius of the particle. When the curvature radius of the particle near the grain boundary varies depending on the location, the largest curvature radius among measurement points is considered as the radius of the particle. For example, as shown in FIG. 10(A), a grain boundary having a length of $a_{AB}$ is formed between a pair of fine particles A and B that undergo sintering. In this case, the shape of the particle A near the grain boundary is approximated by the arc of an imaginary circle A shown in a dashed line. On the other hand, for the shape of the particle B near the grain boundary, one is approximated by the arc of an imaginary circle $B_1$ shown in a dotted line, and the other is approximated by the arc of an imaginary circle $B_2$ shown in a solid line. As shown in FIG. 10(B), $r_{B2}$ is larger than $r_{B1}$, and therefore $r_{B2}$ is considered as the radius $r_B$ of the particle B. The aforementioned imaginary circle can be determined by a method in which a boundary is defined by monochromatic binarization processing of an observed image at the cross section or the surface, and central coordinates and a radius are calculated by a least square method based on the coordinates of the boundary near the grain boundary.

When it is difficult to accurately measure the sintering-necking onset temperature based on the aforementioned definition, a first electroconductive layer containing fine particles is formed, an insulating layer is formed thereon, and a temperature, at which an opening section (cracks) is generated in the insulating layer by heating, can be considered as a sintering-necking onset temperature. As mentioned later, when heating is carried out during formation of the insulating layer, the temperature at which an opening (crack) is generated by heating of the substrate during formation of the insulating layer can be considered as a sintering-necking start temperature.

For the material forming the first electroconductive layer, a paste or the like containing a binder resin or the like can be suitably used, besides the aforementioned low-melting-point material (and the high-melting-point material). To sufficiently improving the electroconductivity of the first electroconductive layer formed by a screen printing method, it is desirable to cure the first electroconductive layer by a heat treatment. Therefore, for the binder resin contained in the paste, a material that can be cured at the aforementioned drying temperature is preferably used, and an epoxy-based resin, a phenol-based resin, an acrylic resin and the like are applicable. This is because in this case, the shape of the low-melting-point material is changed as it is cured, and as shown in FIG. 7 at step 7E, an opening (cracks) is easily generated in the insulating layer near the low-melting-point material during the heating. It suffices that the ratio between the binder resin and the electroconductive low-melting-point material is set so as to be equal to or more than the so-called percolation threshold (a critical value of a ratio corresponding to the low-melting-point material content at which electroconductivity is exhibited).

The first electroconductive layer 71 can be prepared by a known technique such as an inkjet method, a screen printing method, a conductor wire bonding method, a spray method, a vacuum deposition method, or a sputtering method. The first electroconductive layer 71 is preferably patterned in a specific shape such as a comb-like pattern. For formation of the patterned first electroconductive layer, the screen printing method is suitable to increase productivity. For the screen printing method, a method is suitably used in which a collecting electrode pattern is printed using a printing paste containing a low-melting-point material made of metal particles and a screen plate having an opening pattern matching the pattern shape of the collecting electrode.

On the other hand, when a material containing a solvent is used as a printing paste, a drying step for removing the solvent is required. The drying temperature in this case is preferably lower than the thermal-fluidization onset temperature $T_1$ of the low-melting-point material. The drying time can be appropriately set at, for example, about 5 minutes to 1 hour.

The first electroconductive layer may be composed of a plurality of layers. The first electroconductive layer may have, for example, a layered structure composed of a lower layer having a low contact resistance with a transparent electrode layer on the surface of a photoelectric conversion section and an upper layer containing a low-melting-point material. According to this structure, it can be expected that the fill factor of the solar cell is improved as contact resistance with the transparent electrode layer decreases. It can be expected that the first electroconductive layer is made still less resistive by forming a layered structure of a layer with low-melting-point material and a layer with high-melting-point material.

Explanations have been provided above principally for the case of forming the first electroconductive layer by a printing method, but the method for forming the first electroconductive layer is not limited to the printing method. For example, the first electroconductive layer may be formed by a deposition method or a sputtering method using a mask matching the pattern shape.

(Insulating Layer)

The insulating layer 9 is formed on the first electroconductive layer 71. Here, when the first electroconductive layer 71 is formed in a specific pattern (e.g. a comb-like pattern), the surface of the photoelectric conversion section 50 has a first electroconductive layer-formed region where the first electroconductive layer is formed, and a first electroconductive layer-non-formed region where no first electroconductive layer is formed. In the present invention, the insulating layer 9 is formed at least on the first electroconductive layer-formed region and the insulating region 5x of the first electroconductive layer non-formed region.

The insulating layer 9 is formed such that the insulating region 5x is at least partially covered therewith. When a plurality of insulating regions exist as shown in each embodiment in FIG. 4, at least one insulating region thereof is covered with the insulating layer 9. The "one insulating region" means a region formed on the principal surface or the side surface of the photoelectric conversion section in any one step. For example, when the insulating region is formed using a mask as in an example illustrated in FIG. 4 at step 4A1, each of the insulating regions 511x, 521x, 522x, 523x and 512x is one insulating region. FIG. 4 at step 4A2 illustrates an example where among these insulating regions, all of the insulating regions 511x and 521x on the first principal surface side and the insulating region 522x on the side surface, and the whole of the insulating region 523x on the second principal surface side are covered with the insulating layer 9. In an example illustrated in FIG. 5 at step 5A1 where the insulating region is formed by laser irradiation, one insulating region 527x is formed, and in FIG. 5 at step 5A2, the whole of the insulating region 527x is covered with the insulating layer 9. In an example illustrated in FIG. 5 at step 5B1, the insulating region 515x is formed on the first principal surface side and the insulating region 528x is formed on the second principal surface side; and in FIG. 5 at step 5B2, the whole of the insulating region 515x on the first principal surface side is covered with the insulating layer 9. In an example illustrated in FIG. 6 at step 6B1 where the insulating region is formed by cleaving the substrate, an insulating region 529'x formed by laser irradiation, and the cut surface 520x as an insulating region are formed, and in FIG. 6 at step 6B2, all of these insulating regions are covered with the insulating layer 9.

In the present invention, especially preferably all of the insulating regions are covered with the insulating layer for further enhancing the impurity diffusion blocking effect. When the insulating layer is formed directly on the surface or the side surface of the crystalline silicon substrate 1, a crystalline silicon surface passivation effect or the like can be obtained by appropriately selecting a material and a production method of the insulating layer. The material of the insulating layer with which the insulating region is covered may be the same as or different from that of the insulating layer formed on the first electroconductive layer-formed region, but preferably the same material is used from the viewpoint of productivity. When the same material is used, the insulating layer covering the insulating region and the insulating layer on the first electroconductive layer-formed region are preferably formed simultaneously.

In the present invention, for simplifying the production process, the whole of the insulating region is preferably covered with the insulating layer 9 when the insulating layer 9 is formed on the first electroconductive layer. On the other hand, when a part of the insulating region is covered with the insulating layer 9 and other parts are not covered with the insulating layer in the insulating layer forming step, another step may be provided before or after the above-described step to cover the whole of the insulating region with the insulating layer.

Further, in the present invention, preferably the insulating layer is also formed on the first electroconductive layer non-formed region excepting the insulating region 5x, and especially preferably the insulating layer is formed on the entire surface of the first electroconductive layer non-formed region of the first principal surface. When the insulating layer is also formed on the first electroconductive layer non-formed region, the photoelectric conversion section can be chemically and electrically protected from a plating solution when the second electroconductive layer is formed by a plating method. Diffusion of impurities in a plating solution to the crystalline silicon substrate can also be suppressed, so that improvement of long-term reliability can be expected.

For example, when the transparent electrode layer 6a is formed on the first principal surface side of the photoelectric conversion section 50 as in the heterojunction solar cell shown in FIG. 2, the insulating layer 9 is formed on the surface of the transparent electrode layer 6a to inhibit contact of the transparent electrode layer with a plating solution, so that deposition of a metal layer (second electroconductive layer) onto the transparent electrode layer can be prevented. More preferably, the insulating layer is formed on the whole of the first electroconductive layer-formed region and the first electroconductive layer non-formed region, from the viewpoint of productivity.

As the material of the insulating layer 9, a material that is electrically insulating is used. It is desirable that the insulating layer 9 be a material having chemical stability to a plating solution. By using a material having high chemical stability to a plating solution, problems such as denaturation of the insulating layer, for example, by dissolution and peeling of the layer hardly occur in a plating step during formation of the second electroconductive layer, so that damage to the surface of the photoelectric conversion section is hindered. When the insulating layer 9 is formed on the first electroconductive layer-non-formed region as well, the insulating layer preferably has high adhesive strength with the photoelectric conversion section 50. For example, in the heterojunction solar cell, the insulating layer 9 preferably has high adhesive strength with the transparent electrode layer 6a on the surface of the photoelectric conversion section 50. By increasing adhesive strength between the transparent electrode layer and the insulating layer, the insulating layer becomes hard to peel off during the plating step, so that deposition of a metal onto the transparent electrode layer can be prevented.

For the insulating layer 9, a material having low optical absorption is preferably used. The insulating layer 9 is formed on the light incident surface side of the photoelectric conversion section 50, and therefore if optical absorption by the insulating layer is low, a larger amount of light can be introduced into the photoelectric conversion section. For example, when the insulating layer 9 has sufficient transparency with a transmittance of 90% or more, the optical loss at the insulating layer by optical absorption is low, the solar cell can be provided for a practical use without removing the insulating layer after forming the second electroconductive layer. Consequently, the process for manufacturing the solar cell can be simplified, so that productivity can be further improved. When a solar cell is provided for a practical use without removing the insulating layer 9, it is desirable that a material having sufficient weather resistance and stability to heat/humidity in addition to transparency is used for forming the insulating layer 9.

The material of the insulating layer may be an inorganic insulating material or an organic insulating material. As the inorganic insulating material, a material such as silicon oxide, silicon nitride, titanium oxide, aluminum oxide, magnesium oxide or zinc oxide can be used. As the organic insulating material, a material such as polyester, an ethylene-vinyl acetate copolymer, acrylic, epoxy or polyurethane can be used. The material of the insulating layer is preferably an inorganic material having a low elongation at break, so that formation of an opening in the insulating layer, which occurs as the surface shape of the first electroconductive layer changes by stress or the like at the interface, in the annealing step is facilitated Among these inorganic materials, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, strontium titanate or the like is suitably used from the viewpoints of resistance to a plating solution and transparency of the material. Above all, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride or the like is preferable from the viewpoints of electrical characteristics, adhesiveness with the transparent electrode layer, and so on, and silicon oxide, silicon nitride or the like is especially suitably used to adjust the refractive index appropriately. These inorganic materials are not limited to those having a stoichiometric composition, but may be those having oxygen-deficiencies.

The thickness of the insulating layer 9 may be set appropriately, according to the material of the insulating layer and method of formation thereof. The thickness of the insulating layer 9 is preferably so thin that an opening section can be formed in the insulating layer by stress or the like at the interface, which occurs as the surface shape of the first electroconductive layer is changed in the annealing step. Accordingly, the thickness of the insulating layer 9 is preferably 1000 nm or less, more preferably 500 nm or less. By appropriately setting the optical characteristics and thickness of the insulating layer 9 in a first electroconductive layer-non-formed region, light reflection characteristics are improved, and the amount of light introduced into the solar cell is increased, so that conversion efficiency can be further improved. For obtaining this effect, the refractive index of the insulating layer 9 is preferably lower than the refractive index of the surface of the photoelectric conversion section 50. In order to impart suitable antireflection characteristics to the insulating layer 9, the thickness is preferably set within a range of 30 nm to 250 nm, and more preferably set within a range of 50 nm to 250 nm. The thickness of the insulating layer on the first electroconductive layer-formed region and the thickness of the insulating layer on the first electroconductive layer-non-formed region may be mutually different. For example, the thickness of the insulating layer may be set so as to facilitate a formation of an opening section in the annealing step as to the first electroconductive layer-formed region, and the thickness of the insulating layer may be set so as to have an optical thickness with appropriate antireflection characteristics as to the first electroconductive layer-non-formed region. The insulating region of the first electroconductive layer non-formed region may be set so that the thickness of the insulating layer is larger than that in the first electroconductive layer-formed region, so that the surface of the silicon substrate is reliably protected from a plating solution.

When a transparent electrode layer (the refractive index of which is generally about 1.9 to 2.1) is provided on the photoelectric conversion section 50 as in the heterojunction solar cell, the refractive index of the insulating layer is preferably an intermediate value between the refractive index of air (1.0) and the refractive index of the transparent electrode layer to enhance an anti-reflection effect at the interfaces thereby increasing an amount of light introduced into the solar cell. When the solar cells are sealed to be modularized, the refractive index of the insulating layer is preferably an intermediate value between the refractive index of a sealing material and the refractive index of the transparent electrode layer. Accordingly, the refractive index of the insulating layer 9 is, for example, preferably 1.4 to 1.9, more preferably 1.5 to 1.8, further preferably 1.55 to 1.75. The refractive index of the insulating layer can be adjusted to fall within a desired range according to the material, composition and the like of the insulating layer. For example, in the case of silicon oxide, the refractive index is increased by decreasing the oxygen content. Unless otherwise specified, the refractive index in this specification is a refractive index to light having a wavelength of 550 nm and a value measured by spectroscopic ellipsometry. The optical thickness (refractive index×thickness) of the insulating layer is preferably set according to the refractive index of the insulating layer so that anti-reflection characteristics are improved.

The insulating layer can be formed using a known method. For example, in the case of an inorganic insulating material such as silicon oxide or silicon nitride, a dry process such as a plasma-enhanced CVD method or a sputtering method is suitably used. In the case of an organic insulating material, a wet process such as a spin coating method or a screen printing method is suitably used. By these methods, a film of a densified structure having reduced defects such as pinholes can be formed.

Among the above-described deposition methods, a method capable of forming an insulating layer on the insulating region 5x is suitably used. For example, when the insulating region 5x is formed on the side surface of the substrate by a method of cleaving a silicon substrate, etc., a method in which an insulating layer is also formed on the side surface of the substrate is suitably employed. As the method in which an insulating layer is also formed on the side surface of the substrate, a CVD method, a sputtering method or the like is preferable. Above all, the insulating layer 9 is preferably formed by the plasma-enhanced CVD method so as to form a film having a more densified structure. By this method, a film having a structure with high density can be formed even when an insulating layer having a small thickness of ca. 30 to 100 nm, as well as a large thickness of about 200 nm, is formed.

For example, when the photoelectric conversion section 50 has on its surface a textured structure (uneven structure) as shown in FIG. 2, the insulating layer is preferably formed by the plasma-enhanced CVD method so that a densified film may be formed even at recessed and raised portions of the texture. By using an insulating layer having high density, damage to the transparent electrode layer during a plating treatment can be reduced, and also deposition of a metal onto the transparent electrode layer can be prevented. In addition, the insulating layer also has an excellent function as a protective film for preventing entrance of impurities such as copper ions from the insulating region 5x into the silicon substrate 1. Further, the insulating layer having high density can function as a barrier layer to water, oxygen and the like for a layer within the photoelectric conversion section 50, like the silicon-based thin-films 3 in the crystalline silicon-based solar cell in FIG. 2, so that an effect of improving long-term reliability of the solar cell can also be expected.

The shape of the insulating layer 9 present between the first electroconductive layer 71 and the second electroconductive layer 72, i.e. the insulating layer 9 on the first electroconductive layer-formed region, does not have to be necessarily a seamless layer, but may be an island layer. The term "island" in this specification means a state in which a non-formed region, on which no insulating layer 9 is formed, is provided at a part of the surface.

In the present invention, the insulating layer 9 can also contribute to improvement of adhesive strength between the first electroconductive layer 71 and the second electroconductive layer 72. For example, when a Cu layer is formed on an Ag layer as an under-layer electrode by a plating method, adhesive strength between the Ag layer and the Cu layer is low, but it can be expected that the adhesive strength of the second electroconductive layer is increased to improve the reliability of the solar cell as a result of formation of the Cu layer on an insulating layer of silicon oxide or the like.

In one embodiment of the present invention, the annealing step is carried out after the insulating layer 9 is formed on the first electroconductive layer 71 and before the second electroconductive layer 72 is formed. In the annealing step, the first electroconductive layer 71 is heated to a temperature higher than the thermal-fluidization onset temperature $T_1$ of the low-melting-point material, and the low-melting-point material is fluidized, so that the surface shape of the first electroconductive layer is changed. In association with this change, the opening section 9h is formed in the insulating layer 9 on the first electroconductive layer. Therefore, in the subsequent plating step, a part of the surface of the first electroconductive layer 71 is exposed to a plating solution for conducting electricity, thus making it possible to deposit a metal on the conducting part as origination point as shown in FIG. 7 at step 7F.

The opening section is formed principally on the low-melting-point material 711 of the first electroconductive layer 71. When the low-melting-point material is an insulating material, a part immediately below the opening section is insulating, but a plating solution is also penetrated into the electroconductive high-melting-point material present on the periphery of the low-melting-point material, and therefore a conductive connection can be established between the first electroconductive layer and the plating solution.

The annealing temperature (heating temperature) Ta in the annealing step is preferably higher than the thermal-fluidization onset temperature $T_1$ of the low-melting-point material, i.e. $T_1<Ta$. The annealing temperature Ta more preferably satisfies $T_1+1°$ C.$\leq Ta \leq T_1+100°$ C., and further preferably satisfies $T_1+5°$ C.$\leq Ta \leq T_1+60°$ C. The annealing temperature can be appropriately set according to the composition and content of the material of the first electroconductive layer, and so on.

The annealing temperature Ta is preferably lower than the heat-resistant temperature of the photoelectric conversion section 50 as described above. The heat-resistant temperature of the photoelectric conversion section varies depending on the configuration of the photoelectric conversion section. For example, when an amorphous silicon thin-film is provided as in the heterojunction solar cell or the silicon-based thin-film solar cell, the heat-resistant temperature is about 250° C. Thus, in the case of the heterojunction solar cell or the silicon-based thin-film solar cell, in which the photoelectric conversion section includes an amorphous silicon-based thin-film, the annealing temperature is preferably set at 250° C. or lower so that thermal damage at the amorphous silicon-based thin-film and the interface thereof are suppressed. For achieving a solar cell having higher performance, the annealing temperature is more preferably 200° C. or lower, further preferably 180° C. or lower. In association therewith, the thermal-fluidization onset temperature $T_1$ of the low-melting-point material of the first electroconductive layer 71 is preferably lower than 250° C., more preferably lower than 200° C., further preferably lower than 180° C.

On the other hand, a crystalline silicon solar cell having a diffusion layer of an opposite conductivity type on one principal surface of a crystalline silicon substrate of a first conductivity type has neither an amorphous silicon thin-film nor a transparent electrode layer, and therefore shows a heat-resistant temperature of about 800° C. to 900° C. Thus, the annealing step may be carried out at an annealing temperature Ta higher than 250° C.

The method for forming an opening in an insulating layer is not limited to a method in which an annealing treatment is performed after formation of an insulating layer as described above. For example, the opening 9h can be formed almost simultaneously with the formation of the insulating layer 9, as shown by the dotted-line arrow in FIG. 7.

For example, when the insulating layer is formed while the substrate is heated, an opening is formed almost simultaneously with formation of the insulating layer. Here, the term "almost simultaneously with formation of the insulating layer" means a state in which a step other than the insulating layer forming step, such as an annealing treatment, is not performed. In other words, "almost simultaneously with formation of the insulating layer" means a state during or immediately after formation of the insulating layer. The term "immediately after formation" also includes a duration until the substrate is cooled to room temperature etc. after formation of the insulating layer is completed (after heating is stopped). Formation of an opening in the insulating layer on the low-melting-point material also includes a situation in which even after formation of the insulating layer on the low-melting-point material is completed, the insulating layer on the periphery of the low-melting-point material is deformed as the insulating layer is formed on the periphery thereof, so that an opening is formed.

As a method for forming an opening almost simultaneously with formation of the insulating layer, for example, a method is used in which the insulating layer 9 is formed on the first electroconductive layer 71 while the substrate is heated to a temperature Tb higher than the thermal fluidization onset temperature $T_1$ of a low-melting-point material 711 of the first electroconductive layer 71 in the insulating layer forming step. Since the insulating layer 9 is formed on the first electroconductive layer with the low-melting-point material in a fluidized state, stress is generated at a deposition interface concurrently with deposition, so that, opening like a crack, for example, is formed in the insulating layer.

The substrate temperature Tb during formation of the insulating layer (hereinafter, referred to as an "insulating layer forming temperature") refers to a substrate surface temperature at the start of formation of the insulating layer (also referred to as a "substrate heating temperature"). Generally, the mean value of the substrate surface temperature during the formation of the insulating layer is equal to or higher than the substrate surface temperature at the start of deposition. Therefore, when the insulating layer forming temperature Tb is higher than the thermal fluidization onset temperature $T_1$ of the low-melting-point material, a deformed portion such as an opening can be formed in the insulating layer.

For example, when the insulating layer 9 is formed by a dry method such as a CVD method or a sputtering method, an opening can be formed by ensuring that the substrate surface temperature during formation of the insulating layer is higher than the thermal fluidization onset temperature $T_1$ of the low-melting-point material. When the insulating layer 9 is formed by a wet method such as coating, an opening can be formed by ensuring that the substrate surface temperature at the time of drying a solvent is higher than the thermal fluidization onset temperature $T_1$ of the low-melting-point material. The "deposition starting time point" when the insulating layer is formed by a wet method refers to a time point at which drying of a solvent is started. A preferred range of the insulating layer forming temperature Tb is similar to the preferred range of the annealing temperature Ta.

For example, the substrate surface temperature can be measured with a thermo label or a thermocouple attached to the substrate surface on the deposition surface side. The temperature of heating means such as a heater should be appropriately adjusted so that the surface temperature of the substrate falls within a desired range.

When the insulating layer 9 is formed by a plasma-enhanced CVD method, the insulating layer forming temperature Tb is preferably 130° C. or higher, more preferably 140° C. or higher, further preferably 150° C. or higher for forming a dense film. The maximum achieving temperature of the substrate surface during formation of the insulating layer is preferably lower than the heat-resistant temperature of the photoelectric conversion section.

The deposition speed in plasma-enhanced CVD is preferably 1 nm/second or less, more preferably 0.5 nm/second or less, further preferably 0.25 nm/second or less for forming a denser film. When silicon oxide is formed by plasma-enhanced CVD, the deposition conditions preferably include a substrate temperature of 145° C. to 250° C., a pressure of 30 Pa to 300 Pa and a power density of 0.01 W/cm$^2$ to 0.16 W/cm$^2$.

When an opening is formed almost simultaneously with formation of the insulating layer and there are locations where formation of the opening is insufficient, etc., the above-described annealing step may be further performed after the formation of the insulating layer.

(Second Electroconductive Layer)

After the insulating layer 9 having the opening 9h is formed as described above, the second electroconductive layer 72 is formed on the insulating layer 9 of the first electroconductive layer-formed region by a plating method. At this time, the metal deposited as the second electroconductive layer is not particularly limited as long as it is a material that can be formed by a plating method, and for example, copper, nickel, tin, aluminum, chromium, silver, gold, zinc, lead, palladium or the like, or a mixture thereof can be used.

Electric current principally passes through the second electroconductive layer during operation (electricity generation) of the solar cell. Thus, the line resistance of the second electroconductive layer is preferably as low as possible so as to suppress the resistance loss in the second electroconductive layer. Specifically, the line resistance of the second electroconductive layer is preferably 1 Ω/cm or less, more preferably 0.5 Ω/cm or less. On the other hand, it suffices that the line resistance of the first electroconductive layer is so low that the layer can function as an underlying layer at the time of electroplating, with an example thereof being 5 Ω/cm or less.

The second electroconductive layer can be formed by either of an electroless plating method and an electrolytic plating method, but the electrolytic plating method is suitably used in order to increase productivity. In the electrolytic plating method, the rate of deposition of a metal can be increased, so that the second electroconductive layer can be formed in a short time.

Figure 11:
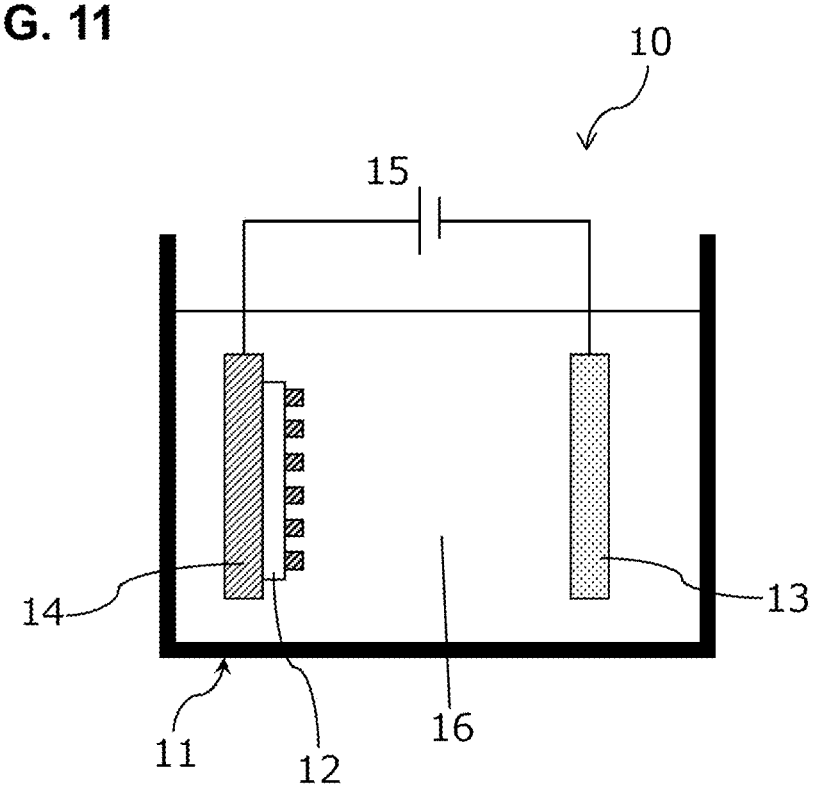
FIG. 11 is a structural schematic view of a plating apparatus.

A method for forming a second electroconductive layer by the electrolytic plating method will be described taking acidic copper plating as an example. FIG. 11 is a conceptual view of a plating apparatus 10 that is used for forming the second electroconductive layer. A substrate 12, which has a first electroconductive layer and an insulating layer formed on a photoelectric conversion section, and is subjected to an annealing treatment, and an anode 13 are immersed in a plating solution 16 in a plating tank 11. The first electroconductive layer 71 on the substrate 12 is connected to a power source 15 through a substrate holder 14. By applying a voltage between the anode 13 and the substrate 12, copper can be selectively deposited at a part on the first electroconductive layer, which is not covered with the insulating layer 9, i.e. an opening section generated in the insulating layer by the annealing treatment, as an origination point.

The plating solution 16 used for acidic copper plating contains copper ions. For example, a solution of known composition, which has copper sulfate, sulfuric acid and water as main components, can be used, and by causing a current of 0.1 to 10 A/dm$^2$ to pass therethrough, a metal as the second electroconductive layer can be deposited. The suitable plating time is appropriately set according to the area of a collecting electrode, the current density, cathode current efficiency, desired thickness and so on.

The second electroconductive layer may be composed of a plurality of layers. For example, by forming a first plating layer, made of a material having a high electroconductivity, such as Cu, on the first electroconductive layer with an insulating layer interposed therebetween, and then forming on the surface of the first plating layer a second plating layer excellent in chemical stability, a collecting electrode having low resistance and being excellent in chemical stability can be formed.

It is preferable that after carrying out the plating step, a plating solution removing step be provided to remove a plating solution remaining on the surface of the substrate 12. By providing the plating solution removing step, a metal that can be deposited at a part, other than at the opening section 9h of the insulating layer 9 formed in the annealing step, as an origination point can be removed. Examples of the metal deposited at a part other than at the opening section 9h as an origination point include those deposited at a pinhole in the insulating layer 9 as an origination point. As a result of removing such a metal by the plating solution removing step, the shading loss is reduced, and solar cell characteristics can be further improved.

Removal of the plating solution can be performed by, for example, a method in which plating solution remaining on the surface of the substrate 12 taken out from a plating tank is removed by air blow-type air washing, rinsing is then carried out, and a washing fluid is blown off by air blow. By reducing the amount of plating solution remaining on the surface of the substrate 12 by carrying out air washing before rinsing, the amount of the plating solution brought in at the time of rinsing can be decreased. Therefore, the amount of washing fluid required for rinsing can be decreased, and time and effort for waste liquid treatment associated with rinsing can also be reduced, so that environmental burdens and expenses resulting from washing are reduced, and productivity of the solar cell can be improved.

Here, generally a transparent electrode layer of ITO or the like and an insulating layer of silicon oxide or the like are hydrophilic, and the contact angle of the surface of the substrate 12, i.e. the surface of the photoelectric conversion section 50 or the surface of the insulating layer 9, with water is often about 10° or less. On the other hand, the contact angle of the surface of the substrate 12 with water is preferably 20° or more for facilitating removal of a plating solution by air blowing or the like. For increasing the contact angle at the surface of the substrate, the surface of the substrate 12 may be subjected to a water-repellent treatment. The water-repellent treatment is performed by, for example, forming a water-repellent layer on the surface. By the water-repellent treatment, wettability of the surface of the substrate to a plating solution can be reduced.

In place of the water-repellent treatment of the surface of the insulating layer 9, the insulating layer 9 having water repellency may be formed. That is, by forming the insulating layer 9 having a large contact angle θ (e.g. 20° or more) with water, a special water-repellent treatment step can be omitted, and therefore productivity of the solar cell can be further improved. Examples of the method for imparting water repellency to the insulating layer include a method in which a silicon oxide layer as the insulating layer is formed by a plasma-enhanced CVD method with the conditions for deposition of the insulating layer (e.g. the flow ratio between a silicon raw material gas and an oxygen raw material gas introduced into a deposition chamber) changed.

In the present invention, an insulating layer removing step may be carried out after forming the collecting electrode (plating step). For example, when a material having large optical absorption is used as the insulating layer, the insulating layer removing step is preferably carried out for suppressing reduction of solar cell characteristics by the optical absorption of the insulating layer. The method for removing the insulating layer is appropriately selected according to the characteristics of the insulating layer material. For example, the insulating layer can be removed by chemical etching or mechanical polishing. An ashing (incineration) method is also applicable depending on the material. At this time, it is preferable that the insulating layer on the first electroconductive layer-non-formed region is entirely removed, so that an influx of light is further improved. When a material having small optical absorption such as silicon oxide is used as the insulating layer, it is not necessary to carry out the insulating layer removing step.

Explanations have been provided principally for the case of providing the collecting electrode 70 on the light incident side of the heterojunction solar cell, but a similar collecting electrode may also be formed on the back side. A solar cell using a crystalline silicon substrate, like the heterojunction solar cell, has a high current value, so that generally the electricity generation loss due to contact resistance between the transparent electrode layer and the collecting electrode tends to be remarkable. In contrast, in the present invention, the collecting electrode having the first electroconductive layer and the second electroconductive layer has low contact resistance with the transparent electrode layer, thus making it possible to reduce the electricity generation loss resulting from contact resistance.

The present invention is applicable to various kinds of solar cells such as: crystalline silicon solar cells other than the heterojunction solar cell; solar cells using a semiconductor substrate other than silicon, such as GaAs; silicon-based thin-film solar cells having a transparent electrode layer on a pin junction or a pn junction of an amorphous silicon-based thin-film or a crystalline silicon-based thin-film, compound semiconductor solar cells such as CIS and CIGS; and organic thin-film solar cells, such as dye-sensitized solar cells and organic thin-film (electroconductive polymer).

The crystalline silicon solar cell includes a configuration in which a diffusion layer of an opposite conductivity type (e.g. n-type) is provided on one principal surface of a crystalline silicon substrate of a first conductivity type (e.g. p-type), and the collecting electrode is provided on the diffusion layer. In this configuration, by providing an insulating region freed of a conductivity type semiconductor layer (n-type diffusion layer or p$^+$ layer) as the outermost surface layer, a short circuit of the conductivity type layers on the front side and the back side of the silicon substrate can be prevented, and also, diffusion of copper and the like to the silicon substrate in the plating step may be suppressed. When the photoelectric conversion section does not include an amorphous silicon layer or a transparent electrode layer, the thermal fluidization onset temperature $T_1$ of the low-melting-point material in the first electroconductive layer, the annealing temperature Ta, and the substrate temperature Tb may be higher than 250° C.

In the crystalline silicon solar cell, a collecting electrode patterned in a specific shape such as a comb shape is formed on the first principal surface which is on the light incident side, and a metal electrode layer is provided on the back side in some cases. In this configuration, a short circuit on the front side and the back side easily occurs due to wraparound of the metal electrode layer, and therefore by providing an insulating region on the second principal surface or the side surface, a short circuit of the metal electrode layer and the diffusion-type layer (e.g. n-layer) on the first principal surface side can be prevented.

In a silicon-based thin-film solar cell using an amorphous silicon thin-film, a crystalline silicon thin-film or the like, and a thin-film solar cell such as a compound solar cell such as CIGS or CIS, an organic thin-film solar cell or a dye-sensitized solar cell, a transparent electrode layer is provided on a surface of a photoelectric conversion section on the light receiving surface side in order to reduce the surface resistance of the light receiving surface. Even in this configuration, by providing an insulating region freed of a transparent electrode layer which is the outermost surface layer, a short circuit can be prevented, and also a collecting electrode can be formed with high productivity in the plating step.

The solar cell of the present invention is preferably modularized when put into practical use. Modularization of the solar cell is performed by an appropriate method. For example, by connecting a bus bar via an interconnector such as a TAB to a collecting electrode, a plurality of solar cells are connected in series or in parallel, and sealed by a sealing material and a glass plate to thereby perform modularization. Particularly, when the insulating layer is formed on the front surface and the side surface of the substrate, a short circuit at the time of modularization is inhibited, resulting in excellent productivity in the modularization step.

EXAMPLES

The present invention will be more specifically described below by showing examples relating to the heterojunction solar cell shown in FIG. 2, but the present invention is not limited to the Examples below.

Example 1

In Example 1, a heterojunction-type solar cell was subjected to an insulation treatment and a collecting electrode was formed using the method shown in FIG. 7.

(Formation of Photoelectric Conversion Section)

An n-type single-crystalline silicon wafer having a light incident surface direction identical to the (100) surface and having a thickness of 200 µm was provided as a single-crystalline silicon substrate of a first conductivity type. The silicon wafer was immersed in a 2 wt % aqueous HF solution for 3 minutes to remove silicon oxide covering on the surface, and thereafter rinsed twice with ultrapure water. The silicon substrate was immersed in a 5/15 wt % aqueous KOH/isopropyl alcohol solution held at 70° C. for 15 minutes, and the surface of the wafer was etched to form a textured surface. Thereafter, the wafer was rinsed twice with ultrapure water. The surface of the wafer was observed using an atomic force microscope (AFM manufactured by Pacific Nanotechnology, Inc.), and it was confirmed that the surface of the wafer was etched, and a pyramidal texture surface exposed at the (111) plane was formed.

The wafer after etching was introduced into a CVD apparatus, and at the light incident side thereof, i-type amorphous silicon was formed with a thickness of 5 nm as an intrinsic silicon-based thin-film 2a. Conditions for forming i-type amorphous silicon included a substrate temperature of 170° C., a pressure of 120 Pa, a $SiH_4/H_2$ flow ratio of 3/10 and a power density supply of 0.011 W/cm$^2$. The thickness of the thin-film in this example is a value calculated from a formation rate determined by measuring the thickness of a thin-film formed on a glass substrate under the same conditions using a spectroscopic ellipsometry (trade name: M2000, manufactured by J.A. Woollam Co. Inc.).

On the i-type amorphous silicon layer 2a, p-type amorphous silicon was formed with a thickness of 7 nm as a silicon-based thin-film 3a of an opposite conductivity type. Conditions for forming the p-type amorphous silicon layer 3a included a substrate temperature of 150° C., a pressure of 60 Pa, a $SiH_4/B_2H_6$ flow ratio of 1/3 and a power density supply of 0.01 W/cm$^2$. The $B_2H_6$ gas flow rate mentioned above is a flow rate of a diluting gas wherein $B_2H_6$ concentration was diluted to 5000 ppm using $H_2$ gas.

Thereafter, on the back side of the wafer, an i-type amorphous silicon layer was formed with a thickness of 6 nm as an intrinsic silicon-based thin-film 2b. Conditions for forming the i-type amorphous silicon layer 2b were the same as those for the aforementioned i-type amorphous silicon layer 2a. On the i-type amorphous silicon layer 2b, an n-type amorphous silicon layer was formed with a thickness of 8 nm as a silicon-based thin-film 3b of the first conductivity type. Conditions for forming the n-type amorphous silicon layer 3b included a substrate temperature of 150° C., a pressure of 60 Pa, a $SiH_4/PH_3$ flow ratio of 1/2 and a power density supply of 0.01 W/cm$^2$. The $PH_3$ gas flow rate mentioned above is a flow rate of a diluting gas wherein $PH_3$ concentration was diluted to 5000 ppm using $H_2$ gas.

Indium tin oxide (ITO, refractive index: 1.9) was formed thereon with a thickness of 100 nm as transparent electrode layers 6a and 6b, respectively. The transparent electrode layer was formed by applying a power density of 0.5 W/cm$^2$ in an argon atmosphere at a substrate temperature of room temperature and a pressure of 0.2 Pa using a compound sintered compact of indium oxide and tin oxide as a target. On the back side transparent electrode layer 6b, silver was formed with a thickness of 500 nm as a back side metal electrode layer 8 by a sputtering method.

The silicon-based thin-film, transparent electrode layer and back side metal electrode were formed on the entire surface of the wafer (the whole of a surface that is exposed to plasma during deposition by CVD or sputtering) without using a mask.

On the light incident side transparent electrode layer 6a of the photoelectric conversion section formed in the manner described above, a collecting electrode 70 having a first electroconductive layer 71 and a second electroconductive layer 72 were formed.

(Formation of First Electroconductive Layer)

For formation of the first electroconductive layer 71, a printing paste containing SnBi metal powder (particle size $D_L$=25 to 35 µm; melting point $T_1$=141° C.) as a low-melting-point material and a silver powder (particle size $D_H$=2 to 3 μm; melting point $T_2$=971° C.) as a high melting-point material at a weight ratio of 20:80, and further containing an epoxy-based resin as a high melting-point material binder resin was used. The printing paste was screen-printed using a screen plate of #230 mesh (opening width: l=85 μm) having an opening width (L=80 μm) matching a collecting electrode pattern, and dried at 90° C.

(Formation of Insulating Region: Cleavage of Silicon Wafer)

First, the wafer was transferred to a laser processing apparatus, and a groove was formed over the whole circumference of the outer peripheral portion of the wafer as shown in FIG. 6 at step 6A1 using laser light. The groove was positioned at a distance of 0.5 mm from the edge of the wafer. A third harmonic (wavelength: 355 nm) of a YAG laser was used as laser light, and the depth of the groove was about ⅓ of the thickness of the wafer. Subsequently, as shown in FIG. 6 at step 6B1, the wafer was bent along the groove to cleave off the end portion, so that the outer peripheral portion of the wafer was removed. Through this step, the side surface of the wafer was provided with an insulating region where none of a silicon-based thin-film, a transparent electrode layer and a back side metal electrode was deposited.

(Formation of Insulating Layer)

The wafer with the first electroconductive layer 71 formed thereon and then cleaved was introduced into a CVD apparatus, and a silicon oxide layer (refractive index: 1.5) was formed on the light incident surface side with a thickness of 120 nm as an insulating layer 9 by a plasma-enhanced CVD method.

Figure 13:
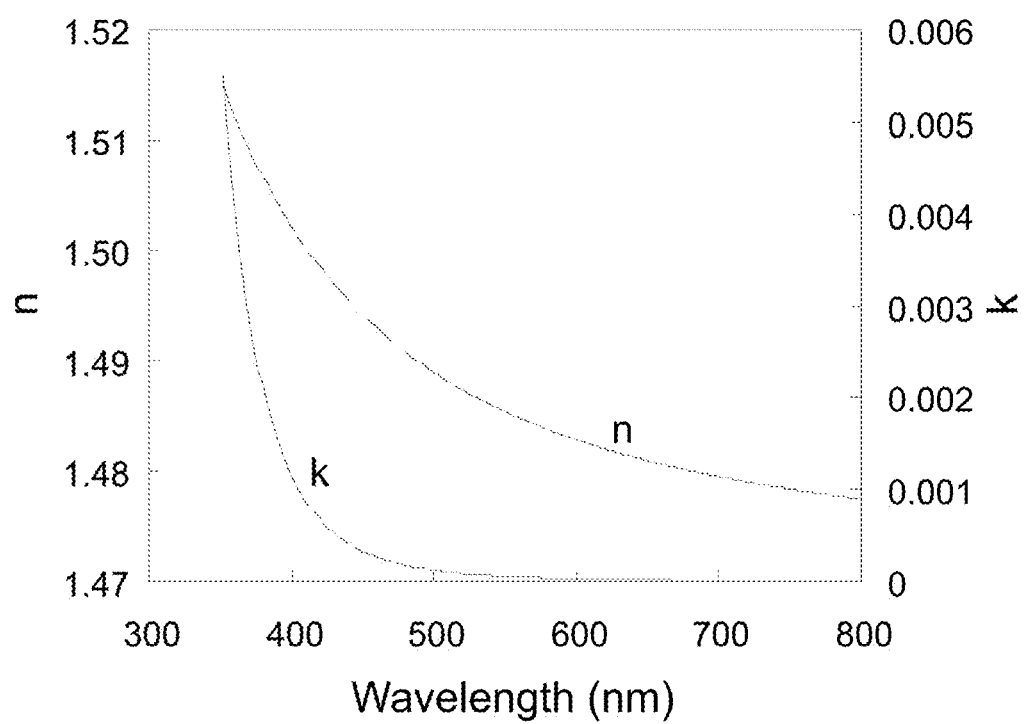
FIG. 13 shows optical characteristics of an insulating layer in Examples.

Conditions for forming the insulating layer 9 included a substrate temperature of 135° C., a pressure of 133 Pa, a $SiH_4/CO_2$ flow ratio of 1/20 and a power density supply of 0.05 W/cm² (frequency 13.56 MHz). The refractive index (n) and extinction coefficient (k) of the insulating layer formed on the light incident side under the conditions were as shown FIG. 13. Thereafter, the wafer after formation of the insulating layer was introduced into a circulating hot air oven, and subjected to an annealing treatment at 180° C. for 20 minutes in an air atmosphere.

The substrate 12 subjected to steps up to and including the annealing step as described above was introduced into a plating tank 11 as shown in FIG. 11. For a plating solution 16, one obtained by adding additives (product numbers: ESY-2B, ESY-H and ESY-1A, manufactured by Uyemura & CO., LTD.) to a solution prepared so that the concentrations of copper sulfate pentahydrate, sulfuric acid and sodium chloride were 120 g/l, 150 g/l and 70 mg/l, respectively, was used. Using the plating solution, plating was carried out under conditions including a temperature of 40° C. and a current of 3 A/dm², so that on the insulating layer on the first electroconductive layer 71, copper was uniformly deposited at a thickness of about 10 μm as a second electroconductive layer 72. Little copper was deposited onto a region where no first electroconductive layer was formed.

Reference Example 1

In the same manner as in Example 1, a silicon-based thin-film, a transparent electrode layer and a back side metal electrode were formed on the entire surface of a wafer without using a mask, so that a photoelectric conversion section was formed. Thereafter, a first electroconductive layer was formed in the same manner as in Example 1. After the formation of the first electroconductive layer, an insulating layer and a second electroconductive layer were formed in the same manner as in Example 1 except that a silicon wafer was not cleaved after formation of a first electroconductive layer.

A substrate after formation of the second electroconductive layer was transferred to a laser processing apparatus, and in the same manner as in Example 1, a groove was formed over the whole circumference of the outer peripheral portion of the substrate using a third harmonic of a YAG laser, and the end portion of the substrate was cleaved off. The solar cell of Reference Example 1 obtained in this manner had substantially the same configuration as that of the solar cell of Example 1, but they were different in that the side surface of the substrate was covered with the insulating layer in Example 1, whereas the side surface of the substrate was exposed in Reference Example 1.

Example 2

Each layer was formed in the same manner as in Example 1 except that a mask was used during formation of each layer, so that a photoelectric conversion section having a cross section schematically shown in FIG. 4 at step 4A1 was formed. Thereafter, a first electroconductive layer, an insulating layer and a second electroconductive layer were sequentially formed in the same manner as in Example 1 except that a silicon wafer was not cleaved. The cross section of the obtained solar cell was as schematically shown in FIG. 4 at step 4A2, where a transparent electrode layer-removed region 511x and a conductivity type semiconductor layer-removed region 521x having a width of about 2 mm, at the outer peripheral portion of the cell, on the first principal surface side, and a conductivity type semiconductor layer-removed region 522x of the side surface were covered with the insulating layer. Further, since a mask was not used during formation of the insulating layer, a transparent electrode layer-removed region 512x and a conductivity type semiconductor layer-removed region 523x on the second principal surface side were also covered with the insulating layer.

Reference Example 2

Figure 12:
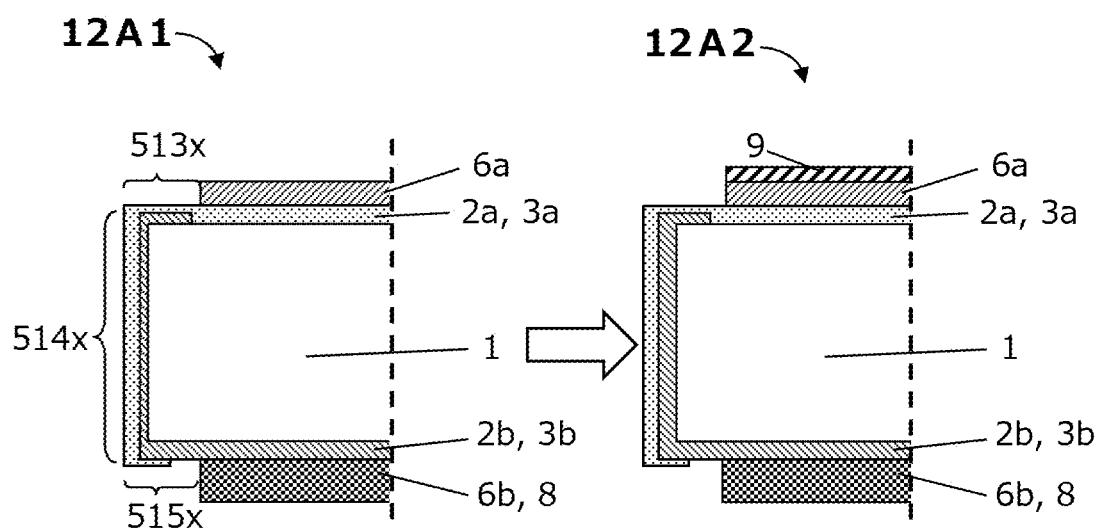
FIG. 12 is a series of schematic sectional views showing a process of manufacturing a solar cell for a Reference Example.

In Reference Example 2, a photoelectric conversion section having a cross section schematically shown in FIG. 12 at step 12A1 was formed in the same manner as in Example 2 except that a mask was not used during formation of an electroconductive silicon thin-film and that a mask was used during formation of a transparent electrode layer and a back side metal electrode. In the configuration shown in FIG. 12 at step 12A1, semiconductor layers 3a and 3b of a conductivity type on the front side and the back side of a substrate were short circuited. On the other hand, regions 513x and 515x having a width of about 2 mm, at the outer peripheral portion of the cell, and a side surface 514x were freed of a short circuit of electrode layers on the front side and the back side because electrode layers 6a, 6b and 8 were not deposited.

Thereafter, a first electroconductive layer, an insulating layer and a second electroconductive layer were sequentially formed on the transparent electrode layer on the first principal surface side in the same manner as in Example 2. Since a mask similar to that used during formation of the transparent electrode layer was used at the time of forming the insulating layer, the obtained solar cell had a cross section schematically shown in FIG. 12 at step 12A2, and electrode layer-removed regions (regions 513x, 514x and 515x) were not covered with the insulating layer.

Comparative Example 1

Steps up to and including formation of the first electroconductive layer (silver electrode) 71 were carried out in the same manner as in Reference Example 1 except that a silver paste containing no low-melting-point material (i.e. the ratio of a metallic material powder to a silver powder was 0:100) was used as a printing paste for formation of a first electroconductive layer. Thereafter, a crystalline silicon-based solar cell with the silver electrode as a collecting electrode was prepared while none of the insulating layer forming step, the annealing step and the second electroconductive layer forming step was performed.

Comparative Example 2

A crystalline silicon-based solar cell was prepared in the same manner as in Reference Example 1 except that an insulating layer was not formed, and a second electroconductive layer was formed using a photolithography method.

Using a spin coating method, a photoresist was applied to the entire surface of a wafer substrate on which layers up to and including a first electroconductive layer were formed. The photoresist was dried, followed by irradiating the photoresist with ultraviolet rays via a photomask having an opening pattern corresponding to the first electroconductive layer. Further, the wafer substrate was immersed in a developer to form an opening pattern of the photoresist on the first electroconductive layer. Thereafter, the wafer substrate was introduced into a plating apparatus, and an electric current was passed through the first electroconductive layer to form a second electroconductive layer at an opening pattern portion of the photoresist. Thereafter, the photoresist was removed with a resist releasing liquid, and an insulation treatment was performed in the same manner as in Reference Example 1.

[Evaluation]

The crystalline silicon-based solar cells of the Examples, Reference Examples and Comparative Examples obtained in the manner described above were irradiated with pseudo sunlight at an energy density of 100 mW/cm$^2$ under 25° C. using a solar simulator having a spectrum distribution of AM 1.5, so that solar cell characteristics were measured. Further, a mini-module including one of the crystalline silicon-based solar cells was prepared, and the mini-module was left standing under an environment with a temperature of 85° C. and a humidity of 85% for 1000 hours to conduct an environmental test.

The mini-module had a structure of: back seat/sealing material/wiring member-connected crystalline silicon-based solar cell/sealing material/glass. The mini-module was connected to an external measurement apparatus via the wiring member attached to the crystalline silicon-based solar cell, and solar cell characteristics were measured using a solar simulator. Solar cell outputs were compared before and after the environmental test to determine the conversion efficiency retention rate=(conversion efficiency after environmental test)/(conversion efficiency before environmental test). In Comparative Example 1, the environmental test was not conducted.

The results of measuring output characteristics (open circuit voltage (Voc), short circuit current density (Jsc), fill factor (FF) and conversion efficiency (Eff)) and conversion efficiency retention rates for the solar cells of Examples, Reference Examples and Comparative Examples are shown in Table 1.

TABLE 1

| | Insulation treatment | | | Second electroconductive layer | Insulating layer | | Solar cell characteristics | | | | Environmental test |
|---|---|---|---|---|---|---|---|---|---|---|---|
| | Method | Stage | Reference Drawing | | Material | On insulating region | Voc | Jsc | FF | Eff. | |
| Reference Example 1 | Cleavage | After plating | | Present | SiO$_2$ | Absent | 0.716 | 36.5 | 76.5 | 20.0 | 0.97 |
| Example 1 | Cleavage | After formation of first electroconductive layer | FIG. 6 at steps 6B1, 6B2 | Present | SiO$_2$ | Present | 0.718 | 36.5 | 76.5 | 20.0 | 0.99 |
| Example 2 | Mask | During deposition | FIG. 4 at steps 4A1 and 4A2 | Present | SiO$_2$ | Present | 0.718 | 36.5 | 76.5 | 20.0 | 0.99 |
| Reference Example 2 | Mask | During deposition | FIG. 12 at steps 12A1 and 12A2 | Present | SiO$_2$ | Absent | 0.718 | 35.8 | 77.0 | 19.8 | 0.96 |
| Comparative Example 1 | Cleavage | After formation of silver electrode | | Absent | | Absent | 0.718 | 35.9 | 74.5 | 19.2 | — |
| Comparative Example 2 | Cleavage | After plating | | Present | | Absent | 0.718 | 35.9 | 76.7 | 19.7 | 0.92 |

Comparison of 1 and 2 with Comparative Example 1 shows that the crystalline silicon-based solar cell of the present invention has improved conversion efficiency (Eff) as compared to the conventional collecting electrode using only a silver paste. This is considered to be because the second electroconductive layer was formed with an underlayer of the first electroconductive layer, and therefore the resistance of the collecting electrode was lowered, so that the fill factor (FF) was improved.

Comparison of Reference Example 1 with Comparative Example 2 shows that the former and the latter were almost comparable in conversion characteristics other than Jsc, but the retention rate after the environmental test in Reference Example 1 was higher than that in Comparative Example 2, with the former being 0.97 and the latter being 0.92. This is considered to be because in Reference Example 1, the surface and the side surface of the substrate were covered with the insulating layer in the plating step, and therefore diffusion of impurities in the plating solution to the silicon substrate was suppressed.

Further, comparison of Example 1 with Reference Example 1 shows that the former and the latter are almost comparable in conversion characteristics, but in Example 1, the retention rate is increased to 0.99. This is considered to be because the side surface of the solar cell is protected by the insulating layer, where the wafer being cleaved to form an insulating region before formation of the insulating layer and the insulating layer being formed thereon (side surface of the wafer). It is considered that similarly, in Example 2, the insulating region is protected by the insulating layer, and therefore a high retention rate was achieved.

In Reference Example 2, conversion efficiency and the retention rate were higher as compared to Comparative Example 2 although silicon-based thin-films of a conductivity type on the front and the back of the silicon substrate were in contact with each other. This is considered to be because the silicon-based thin-film of a conductivity type has a resistance higher than that of the transparent electrode layer, and therefore a short circuit through the silicon-based thin-film of a conductivity type exhibits lower adverse effect as compared to a short circuit through the transparent electrode layer. From this result, it is apparent that in the heterojunction solar cell, it is preferable from the viewpoint of conversion characteristics and reliability that the insulating region is freed of both the transparent electrode layer and the conductivity type semiconductor layer, but even when the insulating region is freed of only the transparent electrode layer, an effect of improvement of conversion characteristics and reliability can be obtained. On the other hand, comparison between Example 2 and Reference Example 2 shows that Example 2 had a higher retention rate. This is ascribable to the fact that in Example 2, the insulating layer is also formed on the insulating region freed of a short circuit, and the surface thereof is thus protected.

As described above using Examples, according to the present invention, a collecting electrode of a solar cell can be prepared by a plating method while ingress of impurities into a silicon substrate is suppressed, thus making it possible to provide a high-power solar cell at low costs.

DESCRIPTION OF REFERENCE CHARACTERS 1 single-crystalline silicon substrate of a first conductivity type
2 intrinsic silicon-based thin-films
3 conductive silicon-based thin-films
6 transparent electrode layers
70 collecting electrode
71 first electroconductive layer
711 low-melting-point material
72 second electroconductive layer
8 back side metal electrode
9 insulating layer
9h opening section
50 photoelectric conversion section
5x insulating region
100 solar cell
101 heterojunction solar cell
10 plating apparatus
11 plating tank
12 substrate
13 anode
14 substrate holder
15 power source
16 plating solution

The invention claimed is:

1. A solar cell comprising a photoelectric conversion section, wherein
the photoelectric conversion section has a first principal surface and a second principal surface, a respective electrode is provided on each of the first principal surface and the second principal surface of the photoelectric conversion section, and the electrode on the first principal surface is a metal collecting electrode with a pattern shape, the first principal surface extending in a first direction and having a width in a second direction, the first direction and the second direction are perpendicular and coplanar to each other,
an outermost surface layer of the photoelectric conversion section on the first principal surface is a semiconductor layer of a conductivity type or a transparent electrode layer,
the solar cell has, on the first principal surface, the second principal surface, or a side surface of the photoelectric conversion section, an exposed region which is freed of components that form the outermost surface layer on the first principal surface and components that form an outermost surface layer on the second principal surface,
the metal collecting electrode includes a first electroconductive layer and a second electroconductive layer in this order from a photoelectric conversion section side, and further includes an insulating layer between the first electroconductive layer and the second electroconductive layer,
each of the first electroconductive layer and the second electroconductive layer includes a metallic material and is patterned to have a shape matching the pattern shape of the metal collecting electrode in a plan view from a third direction perpendicular to both the first direction and the second direction, an entire width of the first electroconductive layer is covered from above in the third direction by the second electroconductive layer in the second direction,
a lower surface of the insulating layer is in direct contact with an upper surface of the first electroconductive layer and an upper surface of the insulating layer is in direct contact with a lower surface of the second electroconductive layer, wherein the upper surface of the first electroconductive layer is a light incident surface,
the insulating layer on the first electroconductive layer is provided with an opening, and the first electroconductive layer and the second electroconductive layer are in conduction with each other via the opening provided in the insulating layer, and
the insulating layer is also formed on a first electroconductive layer non-formed region where the first electroconductive layer is absent, thereby a surface of the exposed region is at least partially overlaid with the insulating layer.

2. The solar cell according to claim 1, wherein the exposed region is provided on a region on an outer periphery with respect to the metal collecting electrode.

3. The solar cell according to claim 1, wherein
the solar cell has the exposed region on the first principal surface or the side surface of the photoelectric conversion section, and
the exposed region of the first principal surface or the side surface has no deposition of components that form the outermost surface layer of the first principal surface, and the surface is at least partially overlaid with the insulating layer.

4. The solar cell according to claim 1, wherein an entire surface of the exposed region is overlaid with the insulating layer.

5. The solar cell according to claim 1, wherein the outermost surface layer of the photoelectric conversion section on the first principal surface is a transparent electrode layer.

6. The solar cell according to claim 5, wherein
the photoelectric conversion section comprises: a silicon-based thin-film; and the transparent electrode layer as the outermost surface layer of the photoelectric conversion section on the first principal surface in this order on one principal surface of a crystalline silicon substrate, and
the metal collecting electrode is provided on the transparent electrode layer.

7. The solar cell according to claim 1, wherein the first electroconductive layer includes a low-melting-point material, and a thermal-fluidization onset temperature $T_1$ of the low-melting-point material is 250° C. or lower.

8. The solar cell according to claim 5, wherein the first electroconductive layer includes a low-melting-point material, and a thermal-fluidization onset temperature $T_1$ of the low-melting-point material is 250° C. or lower.

9. The solar cell according to claim 7, wherein the low-melting-point material includes a metallic material.

10. The solar cell according to claim 1, wherein the second electroconductive layer is mainly composed of copper.

11. The solar cell according to claim 1, wherein when viewed along the first direction, the entire width of the first electroconductive layer is substantially the same as a width of the second electroconductive layer.

12. The solar cell according to claim 1, wherein the pattern shape of the collecting electrode is a comb shape, and each of the first and second electroconductive layers is patterned to have the comb shape.

13. A solar cell module comprising a solar cell having a photoelectric conversion section, wherein
the photoelectric conversion section has a first principal surface and a second principal surface, a respective electrode is provided on each of the first principal surface and the second principal surface of the photoelectric conversion section, and the electrode on the first principal surface is a metal collecting electrode with a pattern shape, the first principal surface extending in a first direction and having a width in a second direction, the first direction and the second direction are perpendicular and coplanar to each other,
an outermost surface layer of the photoelectric conversion section on the first principal surface is a semiconductor layer of a conductivity type or a transparent electrode layer,
the solar cell has, on the first principal surface, the second principal surface, or a side surface of the photoelectric conversion section, an exposed region which is freed of components that form the outermost surface layer on the first principal surface and components that form an outermost surface layer on the second principal surface,
the metal collecting electrode includes a first electroconductive layer and a second electroconductive layer in this order from a photoelectric conversion section side, and further includes an insulating layer between the first electroconductive layer and the second electroconductive layer,
each of the first electroconductive layer and the second electroconductive layer includes a metallic material and is patterned to have a shape matching the pattern shape of the metal collecting electrode in a plan view from a third direction perpendicular to both the first direction and the second direction, an entire width of the first electroconductive layer is covered from above in the third direction by the second electroconductive layer in the second direction,
a lower surface of the insulating layer is in direct contact with an upper surface of the first electroconductive layer and an upper surface of the insulating layer is in direct contact with a lower surface of the second electroconductive layer, wherein the upper surface of the first electroconductive layer is a light incident surface,
the insulating layer on the first electroconductive layer is provided with an opening, and the first electroconductive layer and the second electroconductive layer are in conduction with each other via the opening provided in the insulating layer, and
the insulating layer is also formed on a first electroconductive layer non-formed region where the first electroconductive layer is absent, thereby a surface of the exposed region is at least partially overlaid with the insulating layer.

14. A method of manufacturing a solar cell, the solar cell having a photoelectric conversion section, wherein
the photoelectric conversion section has a first principal surface and a second principal surface, a respective electrode is provided on each of the first principal surface and the second principal surface of the photoelectric conversion section, and the electrode on the first principal surface is a metal collecting electrode with a pattern shape, the first principal surface extending in a first direction and having a width in a second direction, the first direction and the second direction are perpendicular and coplanar to each other,
an outermost surface layer of the photoelectric conversion section on the first principal surface is a semiconductor layer of a conductivity type or a transparent electrode layer,
the solar cell has, on the first principal surface, the second principal surface, or a side surface of the photoelectric conversion section, an exposed region which is freed of components that form the outermost surface layer on the first principal surface and components that form an outermost surface layer on the second principal surface,
the metal collecting electrode includes a first electroconductive layer and a second electroconductive layer in this order from the photoelectric conversion section side, and further includes an insulating layer between the first electroconductive layer and the second electroconductive layer,
each of the first electroconductive layer and the second electroconductive layer includes a metallic material and is patterned to have a shape matching the pattern shape of the metal collecting electrode in a plan view from a third direction perpendicular to both the first direction and the second direction, an entire width of the first electroconductive layer in the second direction is covered from above in the third direction by the second electroconductive layer,
a lower surface of the insulating layer is in direct contact with an upper surface of the first electroconductive layer and an upper surface of the insulating layer is in direct contact with a lower surface of the second electroconductive layer, wherein the upper surface of the first electroconductive layer is a light incident surface, the insulating layer on the first electroconductive layer is provided with an opening, and the first electroconductive layer and the second electroconductive layer are in conduction with each other via the opening provided in the insulating layer, the method comprising:

a first electroconductive layer forming step of forming the first electroconductive layer on the photoelectric conversion section;

an insulating layer forming step of forming the insulating layer on the first electroconductive layer; and a plating step of forming the second electroconductive layer that is in conduction with the first electroconductive layer via the opening provided in the insulating layer, using a plating method, in this order, the exposed region is formed before the insulating layer forming step, and in the insulating layer forming step, the insulating layer is also formed on a first electroconductive layer non-formed region where the first electroconductive layer is absent, thereby a surface of the exposed region is at least partially overlaid with the insulating layer.

15. The method of manufacturing the solar cell according to claim 14, wherein formation of the exposed region is performed after the first electroconductive layer forming step and before the insulating layer forming step.

16. The method of manufacturing the solar cell according to claim 14, wherein in formation of the exposed region, a groove is formed on the photoelectric conversion section; and the photoelectric conversion section is cleaved along the groove, and a cut surface having no deposition of components that form the outermost surface layer is thereby formed on the side surface of the photoelectric conversion section.

17. The method of manufacturing the solar cell according to claim 14, wherein the first electroconductive layer includes a low-melting-point material having a thermal-fluidization onset temperature $T_1$ of 250° C. or lower, after the insulating layer formation step, a heating treatment is carried out at an annealing temperature Ta that is higher than the thermal-fluidization onset temperature $T_1$ of the low-melting-point material, thereby the opening is formed.

18. The method of manufacturing the solar cell according to claim 14, wherein the first electroconductive layer includes a low-melting-point material having a thermal-fluidization onset temperature $T_1$ of 250° C. or lower, in the insulating layer formation step, the insulating layer is formed at a substrate temperature Tb that is higher than the thermal-fluidization onset temperature $T_1$ of the low-melting-point material to form the opening simultaneously with the formation of the insulating layer.

19. The method of manufacturing a solar cell according to claim 14, wherein the photoelectric conversion section comprises a silicon-based thin-film and a transparent electrode layer in this order on one principal surface of a crystalline silicon substrate, and the collecting electrode is formed on the transparent electrode layer.

20. The method of manufacturing a solar cell according to claim 19, wherein the exposed region is formed in a manner that the crystalline silicon substrate is exposed.

* * * * *

UNITED STATES PATENT AND TRADEMARK OFFICE
CERTIFICATE OF CORRECTION

PATENT NO. : 9,722,101 B2
APPLICATION NO. : 14/346261
DATED : August 1, 2017
INVENTOR(S) : Daisuke Adachi and Kenji Yamamoto It is certified that error appears in the above-identified patent and that said Letters Patent is hereby corrected as shown below:

In the Claims

In Column 38, Line 36, Claim 1, insert --in the second direction-- after 'first electroconductive layer' and;

In Column 38, Line 38, Claim 1, delete "in the second direction" following 'layer' and;

In Column 40, Line 5, Claim 13, insert --in the second direction-- after 'first electroconductive layer' and;

In Column 40, Line 7, Claim 13, delete "in the second direction" following 'layer'.

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*